United States Patent
Danforth et al.

[11] Patent Number: 5,997,795
[45] Date of Patent: Dec. 7, 1999

[54] PROCESSES FOR FORMING PHOTONIC BANDGAP STRUCTURES

[75] Inventors: Stephen C. Danforth, Belle Mead; Ahmad Safari, Princeton Junction, both of N.J.; John Ballato, Central, S.C.; Remco Van Weeren, Oldwick; Amit Bandyopadhyay, Edison, both of N.J.

[73] Assignee: Rutgers, The State University, New Brunswick, N.J.

[21] Appl. No.: 09/086,847

[22] Filed: May 29, 1998

Related U.S. Application Data

[60] Provisional application No. 60/047,878, May 29, 1997.

[51] Int. Cl.⁶ .......................... B29C 35/08; B29C 41/02; C04B 35/00
[52] U.S. Cl. .......................... 264/401; 264/219; 264/308; 264/317; 264/603; 347/1; 419/1; 419/36
[58] Field of Search .................................... 264/219, 308, 264/317, 401, 603; 347/1; 419/1, 36

[56] References Cited

U.S. PATENT DOCUMENTS

| | | |
|---|---|---|
| 4,929,402 | 5/1990 | Hull . |
| 5,506,607 | 4/1996 | Sanders, Jr. et al. . |
| 5,738,817 | 4/1998 | Danforth et al. . |
| 5,796,207 | 8/1998 | Safari et al. . |

OTHER PUBLICATIONS

M. Griffith et al., "Freeform Fabrication of Ceramics via Sterolithography", J Am. Ceram. Soc., vol. 79, No. 10, 1996, pp. 2601–2608.

E. Yablonovitch, "Photonic Band–Gap Structures", J. Opt. Soc. Am. B., Feb. 1993, pp. 283–294.

Primary Examiner—Leo B. Tentoni
Attorney, Agent, or Firm—Lerner, David, Littenberg, Krumholz & Mentlik, LLP

[57] ABSTRACT

Solid freeform fabrication techniques are used in direct methods to form photonic bandgap structures, and in indirect methods to form molds for photonic bandgap structures. In the direct methods, solid particulate materials are mixed with a binder and, through a computer-controlled process, are built layer by layer to form the structure. In the indirect methods, unfilled polymeric materials are built layer by layer to form a negative mold for the photonic bandgap structure. The cavities within the mold may then be filled with a slurry incorporating solid particulate materials. Subsequent processing may include mold removal, binder removal, densification and secondary infiltration steps to form a photonic bandgap structure having the desired properties.

6 Claims, 5 Drawing Sheets

PROCESSES FOR FORMING PHOTONIC BANDGAP STRUCTURES

CROSS-REFERENCE TO RELATED APPLICATIONS

The present application claims the benefit of U.S. Provisional Application No. 60/047,878 filed May 29, 1997, the disclosure of which is hereby incorporated by reference herein.

The U.S. government has a paid-up license in this invention and the right in limited circumstances to require the patent owner to license others on reasonable terms as provided for by the terms of Contract No. N00014-94-0015 awarded by the Advanced Research Projects Agency of the Office of Naval Research.

FIELD OF THE INVENTION

The present invention is directed to photonic bandgap structures, and, more particularly, to processes for forming photonic bandgap structures. Still more particularly, the present invention is directed to the manufacture of photonic bandgap structures using solid freeform fabrication techniques.

BACKGROUND OF THE INVENTION

Photonic bandgap structures are man-made periodic lattices, in one, two or three dimensions, which are photonic analogs to semiconductors in electronics. Unlike semiconductors, in which a periodic structure (i.e., the crystal lattice) provides a structure which defines allowed and forbidden energy levels for electron propagation, photonic bandgap materials provide a periodic structure which exhibits a frequency gap where the propagation of electromagnetic waves, including the spontaneous emission of photons with frequencies within the gap, is forbidden for all wave vectors. Depending on the unit cell size of the periodic structure, the crystallographic orientation of the periodic structure, the dielectric constants and indices of refraction of the materials and other factors, these structures can be tailored to propagate electromagnetic waves within only certain wavelength ranges. It has been shown that the dimensions of the periodic lattice have to be on the same order of magnitude as the desired bandgap wavelength. For example, to obtain a bandgap for microwaves and longer wavelengths, the size of the unit cell must be in the millimeter range or greater. Also, similar to semiconductors, "defects" can be introduced, generating energy levels in the forbidden bandgap. This allows for the transmission of selected wavelengths, making the photonic bandgap structures very good optical filters. A schematic representation of a photonic bandgap structure having a periodic lattice in three directions is shown in FIG. 1.

Generally, photonic bandgap structures may be employed in all applications where resonant cavities are utilized, such as filters, impedance matching structures, lasers, etc. Some commercial applications include collision avoidance radar, planar antennas, microwave communications, telecommunication networks, low threshold optical switches, amplifiers and microlasers, and medical imaging.

A conventional photonic bandgap structure may include a mass of a high dielectric matrix material, such as a ceramic, with a lattice of holes extending through the structure in one, two or three dimensions. The holes may be empty (i.e., filled with air or vacuum) or filled with one or more low dielectric materials. Preferably, there should be a difference of at least 2 between the dielectric constant of the matrix material and the dielectric constant of the hole materials. Inverse structures are also possible, with the matrix phase being formed from a material having a relatively low dielectric constant and the hole phase being formed from a material having a relatively high dielectric constant.

In one prior art method for making such structures, hundreds of thousands of tiny holes are drilled in a periodic array through a mass of ceramic in one or more directions. This process is tedious, presents difficulties in obtaining accurate hole size and hole alignment, and does not permit the creation of blind holes within the ceramic mass.

Another prior art process involves the acid-etching of a multiplicity of holes in a single crystal of a ceramic or semiconducting material. In this process, the single crystal is oriented in a preferred direction and a photo-resist material is applied to a surface thereof. The photo-resist material is then selectively cured in a predetermined pattern such that the uncured regions define the pattern of holes which are to extend in one direction through the crystal. The uncured photo-resist material is removed to expose the hole pattern, and the crystal is immersed in an acid or a reactive plasma which attacks the holes, but not the remainder of the surface. After the holes have been formed in the first direction, the process may be repeated to form holes in second and third directions, as desired. In this process, the acid or reactive plasma must attack the crystal material more readily in the direction of the hole than in directions transverse to the direction of the hole so as to prevent ballooning effects and produce holes which have a uniform diameter along their entire extent. Further, it is not possible to produce blind holes using this process.

In yet another prior art process, hundreds of thousands of small spheres of a ceramic material are stacked one at a time in a predetermined array defining the desired latticework of holes. The array is then infiltrated with a polymer which holds the spheres in place and may act as a low dielectric constant matrix phase. This process is obviously tedious, lengthy and costly because of the labor involved.

In still a further prior art process which is similar to chemical vapor deposition processes, reactant gases for forming a desired composition for the hole phase are supplied to a chamber. A plurality of laser beams are moved and focused in the chamber at a point in space at which the combined intensity of the laser beams causes the gases to react and deposit on a selected region of a substrate. In accordance with this process, the laser beams are first moved in a direction away from the substrate to "grow" a thin filament out from the substrate surface. The laser beams are then moved in directions parallel to the substrate surface to "grow" branches out from the filament. By growing multiple parallel filaments and branches interconnecting the filaments, a latticework of a high dielectric constant ceramic can be produced with a desired hole pattern. The latticework can subsequently be infiltrated with a low dielectric polymer to form the matrix phase of the photonic bandgap structure. This process is not only costly, but is limited by the types of materials which can be successfully grown. Also, because the latticework needs to be interconnected in order to support itself, it is difficult to use this process to produce devices having discontinuous lattice structures, including blind holes.

SUMMARY OF THE INVENTION

The present invention provides solid freeform fabrication techniques which overcome the drawbacks of prior art fabrication techniques.

One aspect of the present invention uses solid freeform fabrication techniques in direct methods for forming photonic bandgap devices having a matrix phase and a periodic structural array extending through the matrix phase. According to these methods, a representation of the photonic bandgap device is created on a computer, the representation including a plurality of segments defining the matrix phase and the periodic structural array. Program signals corresponding to each of the segments are then generated in a predetermined sequence to form a plurality of layers one on top of the other, the layers being formed from a mixture of a particulate composition dispersed in a binder. The layers are formed according to the program signals, with the formation of each successive layer being controlled to take place after the mixture in the preceding layer has solidified. At least some of the layers include a matrix phase portion and a periodic structural array portion, one of which portions includes the mixture in solid form and the other of which portions does not include the mixture in solid form. The direct method may be used to form the matrix phase or the periodic structural array. Preferred solid freeform fabrication techniques for forming photonic bandgap devices by direct methods include fused deposition modeling and stereolithography. These techniques permit photonic bandgap devices to be formed with periodic structural arrays which are discontinuous, nonlinear, and varying in cross-sectional dimensions, and permit the introduction of random or non-random "defects" into the structure.

In a variant hereof, the forming step may be performed using two mixtures of a particulate composition dispersed in a binder, with the matrix phase portions of the layers being formed from the first mixture and the periodic structural array portions of the layers being formed from the second mixture.

The photonic bandgap device formed by a direct method may be used in its as formed condition, or it may subjected to further processing steps. One such step is partial or complete binder removal. After binder removal, the device may be partially or fully densified, such as by sintering. Alternatively, a second material may be infiltrated into the pores of the device created by binder removal. Sintering may take place after this infiltration step.

After the photonic bandgap device has been formed, the unfilled phase, whether the periodic structural array or the matrix phase, may be filled with a second material having a substantially different index of refraction or dielectric constant than the filled phase so as to form a completely solid structure.

Another aspect of the present invention uses solid freeform fabrication techniques in an indirect method for forming photonic bandgap devices having a matrix phase and a periodic structural array extending through the matrix phase. A representation of a mold for the photonic bandgap device is created on a computer, the representation including a plurality of segments defining the mold and a cavity within the mold. Program signals corresponding to each of the segments are then generated in a predetermined sequence to form a plurality of layers one on top of the other, the layers being formed from a material having a fluid state and a solid state. Preferably, such material constitutes an unfilled organic material, i.e., an organic material without a solid particulate material dispersed therein. The layers are formed according to the program signals, with the formation of each successive layer being controlled to take place after the material in the preceding layer has solidified. At least some of the layers include a mold portion containing the material in the solid state and a cavity portion not containing the material in the solid state. The mold formed by the indirect method may constitute a negative for either the matrix phase or the periodic structural array. Preferred solid freeform fabrication techniques for forming molds for photonic bandgap devices include fused deposition modeling, stereolithography and Sanders prototyping.

In a variant of this aspect of the invention, the forming step may be performed using two materials having a fluid state and a solid state, with the mold portions of the layers being formed from the first material and the cavity portions of the layers being formed from the second material. Preferably, both materials constitute unfilled organic materials. Once the mold has been completed, a suspension of a solid particulate material dispersed in a solvent may be introduced into the mold to fill at least a portion of the cavity, following which the suspension in the cavity may be solidified. The photonic bandgap device may be used without further processing, i.e., the solidified material may constitute one phase of the photonic bandgap device and the mold material may constitute the other phase of the photonic bandgap device. Alternatively, the mold material may be removed from the solidified material. The solidified material may then be further processed, such as to partially or completely remove any binder therein, to partially or fully densify the structure and/or to infiltrate a second material into the pores of the structure. Optionally, the region where the mold material has been removed may be filled with a material having a substantially different index of refraction or dielectric constant than the solidified material so as to form a completely solid structure.

BRIEF DESCRIPTION OF THE DRAWINGS

A more complete appreciation of the subject matter of the present invention and the various advantages thereof can be realized by reference to the following detailed description, in which reference is made to the accompanying drawings in which.

DETAILED DESCRIPTION OF THE PREFERRED EMBODIMENTS

To begin, a periodic photonic bandgap structure is predicted and designed based on computer simulations. A representation of the design may then be created using CAD-based software. This representation may be sliced into a plurality of layers using commercially available software, such as Quickslice from Stratasys, Inc., and the layering data signals from the software may be used to fabricate the photonic bandgap structure or a mold for same layer by layer using a solid freeform fabrication process. In one aspect of the present invention, known as "direct" forming methods, the software signals may be used to fabricate the photonic bandgap structure directly from solid particulate materials dispersed in a binder using a solid freeform fabrication technique. The formed structure, where applicable, may be subjected to binder removal and sintering steps to obtain the desired final properties. In another aspect of the present invention, known as "indirect" forming methods, the software signals may control a solid freeform fabrication technique to form a negative mold for the photonic bandgap structure. A composition having the desired dielectric properties or desired index of refraction may then be infiltrated into the mold and dried, gelled or cured to a solid state. The mold then may or may not be removed and the resultant structure may be subjected to binder removal and sintering steps, where applicable. For any given material, its dielectric properties and index of refraction are related, and therefore these terms are used interchangeably in the following description.

Figure 1:
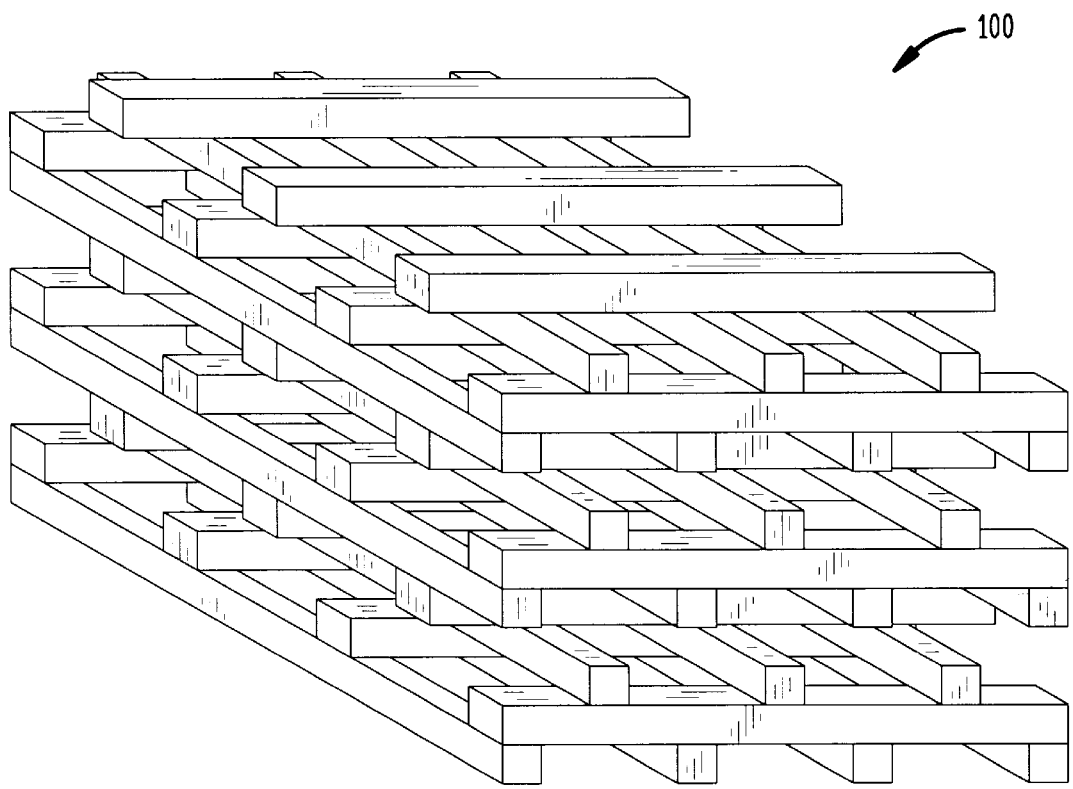
FIG. 1 is a highly schematic representation of a photonic bandgap structure having a periodic lattice in three dimensions.
Figure 2:
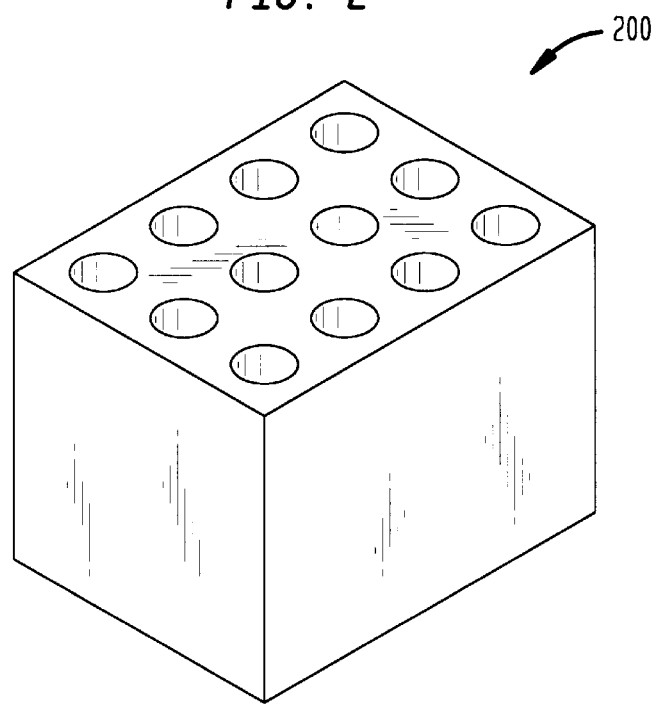
FIG. 2 is a highly schematic representation of a mold for forming a photonic bandgap structure having a periodic lattice in two dimensions.

Generally, the present invention contemplates the use of any solid freeform fabrication technique or layered manufacturing technique to form photonic bandgap structures directly, or to form negative molds for photonic bandgap structures. As used herein, the terms "solid freeform fabrication technique" and "layered manufacturing technique" refer to any forming method which uses computer signals containing information on the design of the article to control an apparatus which fabricates the article in space without the use of any molds, tooling or other shape-defining structure. Typically, solid freeform fabrication techniques involve the generation of data signals defining individual layers of the article, and the deposition of material based on those data signals to fabricate the article on a layer by layer basis. Specific examples of solid freeform fabrication techniques which may be used in practicing the present invention are discussed in detail below in connection with the fabrication of the photonic bandgap device 100 shown in FIG. 1, or the mold 200 for a photonic bandgap device shown in FIG. 2. Photonic bandgap device 100 is an asymmetric cubic ladder structure consisting of square cross-section rods of dielectric material arranged with a periodic separation distance a, with an air gap between each rod. The layers are stacked so that the rods are parallel to the X and Y axes in alternating layers. For any given orientation, the rods in the next layer are shifted by one-half of a unit cell a/2 to yield a face-centered cubic symmetry to the structure in that direction. Mold 200 is configured to yield a photonic bandgap device consisting of rods of circular cross-section extending parallel to one another in the Z direction, with a periodic separation distance b defining an air gap between them.

Fused Deposition Modeling—Direct Method

One method for forming photonic bandgap structures in accordance with the present invention employs fused deposition modeling to form a three-dimensional part directly from a binder with a particulate material dispersed therein. Direct fused deposition modeling processes are described in U.S. Pat. No. 5,738,817, the disclosure of which is hereby incorporated by reference herein.

In an overview of such processes, the layering signals from the CAD software control movement of a dispensing head which dispenses "roads" of a feedstock composition, as well as movement of a build platform on which an object is formed, layer by layer. Where the object has been formed from a particulate material dispersed in a binder, at least a portion of the binder may then be removed from the object and the object may be partially or fully densified by heat treatment or otherwise.

In accordance with the direct methods of the present invention, the fused deposition process may be used to deposit a periodic latticework defining the photonic bandgap structure; to deposit the matrix phase, with the gaps between the roads defining the pattern of holes extending through the structure; or to deposit both the periodic latticework and the matrix phase of the structure.

The feedstock compositions used in the deposition process may be prepared by mixing one or more solid particulate materials with a binder system consisting of one or more organic materials to form a mixture. The particulate materials may be in the form of powders, platelets, granules, whiskers or discontinuous or continuous fibers, or combinations thereof. The amount of particulate materials in the mixture will depend, at least in part, on the bulk density of the article being produced. In that regard, for certain low density applications, the particulate materials may constitute at least about 10 volume percent of the mixture. For forming higher density articles, including articles that are fully dense, the particulate materials may constitute at least about 40 volume percent, and more desirably, at least about 50 volume percent of the mixture.

The particulate materials may be selected from the group consisting of ceramic materials, elemental metals, metal alloys, steels, cermets, semiconductors, and combinations of these materials which exhibit a dielectric constant or index of refraction and other properties within the design criteria for the part. Ceramic materials may include, for example, oxides, carbides, borides, nitrides and the like, as well as combinations thereof; elemental metals may include, for example, silver, gold, platinum, nickel, aluminum, copper, lead, magnesium, manganese, titanium, iron and combinations of these metals; metal alloys may include, for example, alloys and combinations of the foregoing elemental metals; cermets may include any combination of the foregoing ceramics and metals; and semiconductors may include, for example, silicon, gallium arsenide and the like.

It is also contemplated that the particulate material may consist of or include an organic material component having a melting point which is higher than the melting points of the binder system components such that the particles will remain in solid form during the formulation and dispensing of the feedstock composition. These organic material particles may be used alone or in combination with one or more inorganic particulate materials.

The physical properties of the particulate materials employed in the feedstock compositions largely will be dictated by the particular material being used and the properties, including the dielectric constant and index of refraction, sought in each phase of the photonic bandgap structure. In this regard, techniques conventional in the ceramic and metallurgical industries may be utilized to prepare and characterize the particulate materials to be used in the process. Selection of an appropriate particle size distribution is particularly important so that the desired level of solids (low or high) may be loaded into the binder system while maintaining the flowability of the feedstock composition in the fluid state. Also, the size of the largest particles in the distribution should be substantially smaller than the diameter of the dispensing nozzle outlet so as to avoid any bridging effects. A maximum particle size of not more than one-fourth of the nozzle outlet diameter is preferred. There is no minimum particle size, the invention contemplating the use of nanoscale powders alone or in combination with particles in a larger particle size range.

Feedstock compositions need not be in the form of a particulate material dispersed in a binder. That is, in certain photonic bandgap devices, one or more phases of the structure may be formed from an organic material, such as a polymer. In such cases, an organic material having the final composition it is to have in the photonic bandgap device may be placed in a flowable condition, such as by heating above its melting point, and then dispensed in the desired pattern. Such organic materials may include, for example, polyethylene, polypropylene, ABS plastic, other thermosetting or thermoplastic polymers, and like materials. Such organic materials may constitute the entirety of the dispensed composition, i.e., they are not filled or mixed with any other materials. Alternatively, they may be filled or mixed with other materials, such as the inorganic particulate materials described above.

Where particulate materials form part of the feedstock composition, the particulate materials may be mixed with a dispersing agent which modifies the cohesive forces between the particles and the components of the binder system, thereby enhancing the dispersion of the particles within the binder system and improving the flow of the feedstock composition during molding. Dispersing agents may be selected from the group consisting of dispersants, surfactants, coupling agents specific to the material being dispersed and combinations thereof. Dispersing agents typically are derived from fatty acids, fatty glycerol esters, fatty bisamides, and fatty esters not based upon glycerin, and the selection of a particular dispersing agent therefore will depend upon the particulate material and binder system components in the composition. Preferred dispersing agents for use with the preferred binder system described below may be selected from the group consisting of oleyl alcohol (9-octadecen-1-ol), 3-aminopropyltriethoxysilane, KRTTS (Titanium IV 2-propanolato tris (isooctadecanoato-o)), stearic acid, oleic acid, stearyl alcohol, and other such dispersing agents well known in the art. Preferably, between about 0.3 volume percent and about 19 volume percent of the dispersing agent (based upon the volume of the particulate materials), and more preferably between about 3 volume percent and about 12 volume percent of the dispersing agent, may be added to the particulate material so as to produce an approximate surface coverage on the particles of one monolayer. Prior to its addition to the particulate material, the dispersing agent may be dissolved in an appropriate solvent. The dissolved dispersing agent may be intimately combined with the particulate material using conventional mixing techniques, such as ball milling, following which the solvent is removed from the mixture. After removal of the solvent, the particulate material may be screened in a conventional fashion to yield a free-flowing particulate composition. The dispersing agent may, of course, be added directly to the mixture of the particulate materials and the binder system components during the mixing step.

The binder system preferably includes one or more organic components combined together to form a mixture which is either thermoplastic, thermosetting, water soluble, or organic solvent soluble, thermoplastic binder systems being particularly preferred. The formation of the binder system will be influenced by many factors. Among these factors are a desire that the binder system exhibit good flow properties during the fused deposition forming process; be stable under the mixing and forming conditions; be compatible with the other components of the mixture; impart adequate strength in solid form; leave minimal residue following the binder removal step; impart sufficient flexibility to the feedstock composition so that it can be formed into filaments and spooled and unspooled without breakage, yet have enough stiffness and compressive strength to push the mixture out from the dispensing head during the fused deposition forming process as described further below; and have a low cost and long shelf life.

Although other binder systems and, in particular, other thermoplastic binder systems may be used in fused deposition processes, one series of preferred thermoplastic systems which exhibit the rheological and mechanical properties required for the fused deposition of solid particulate materials consists of several components, including a polymer which acts as the backbone of the system to hold the particles together and provide the mixture with a certain strength and stiffness, a wax which acts to lower the overall viscosity of the binder system, an elastomer which increases the flexibility and toughness of the system, and a tackifier which enhances bonding between adjacent roads and successive layers during the fused deposition forming process.

Preferred polymers have a relatively low glass transition temperature and a relatively low melting point. Such polymers may be selected from the group consisting of polyvinyl alcohol, polyethylene, polyvinyl acetate, poly (vinyl ethers), poly (vinyl esters), vinyl ester copolymer, ethylene-vinyl acetate copolymer and combinations thereof. Desirably, the polymer is present in the binder system in amounts of between about 5 volume percent and about 50 volume percent based upon the total volume of the binder system. Preferred waxes may be selected from the group consisting of paraffin waxes, microcrystalline waxes, synthetic hydrocarbon waxes, oxidized polyethylene waxes and combinations of the foregoing. The binder system preferably includes between about 5 volume percent and about 50 volume percent of the wax component. Preferred elastomers may be selected from the group consisting of polychloroprene, styrene-butadiene copolymer, natural rubber, neoprene, polyisoprene, polybutadiene and combinations thereof. The elastomer desirably comprises between about 20 volume percent and about 70 volume percent of the binder system. Preferred tackifiers may be selected from the group consisting of terpene and polyterpene resins, terpene phenolic resins, aliphatic petroleum hydrocarbon resins, rosins, rosin derivatives, such as the ethylene glycol ester of rosin acids, and combinations thereof. Desirably, the tackifier is present in the binder system in amounts of between about 5 volume percent and about 50 volume percent. A particularly preferred binder system includes about 18.75 volume percent of a polymer, about 20.25 volume percent of a wax, about 28.0 volume percent of an elastomer, and about 33.0 volume percent of a tackifier.

In addition to the foregoing components, the binder system may include a plasticizer for increasing its overall flexibility. Selection of an appropriate plasticizer will depend upon several factors, including its compatibility with the particulate material and binder components in the mixture, its effectiveness in increasing the flexibility of the mixture in the solidified state, and its effect on the binder removal step. Preferred plasticizers may be selected from the group consisting of dibutyl phthalate, dihexyl phthalate, triphenyl phosphate, (dipropylene glycol) butyl ether, diethyleneglycolmonoricinoleate and combinations of the foregoing, dibutyl phthalate being particularly preferred. Desirably, the plasticizer is added in amounts of between about 1 volume percent and about 20 volume percent based on the total volume of the binder system.

Once the solid particulate materials and binder system components have been selected, these materials are mixed together to form a mixture. The importance of the mixing step cannot be underestimated, since deficiencies in the quality of the mixture most often cannot be corrected by subsequent processing adjustments. For example, the failure to deagglomerate and evenly distribute the particulate materials within the binder system may result in nonuniform shrinkage and the introduction of flaws within the photonic bandgap structure being produced. Preferably, the particulate materials and the binder system components in the molten or fluid state are mixed together using high shear mixing techniques to form a substantially homogeneous mixture having the desired loading of the particulate materials in the binder system, although mixtures which are less homogeneous or nonhomogeneous are also contemplated.

The mixture may be molded into rods or other blanks for use in the fused deposition forming step, or may be used directly in the fused deposition forming step without prior solidification. Alternatively, the mixture may be solidified and granulated, and used in the fused deposition forming step in the granulated form. In a preferred method, the granulated feedstock composition may be sieved to divide out particles in a preselected particle size range, and then processed through conventional apparatus to form continuous flexible filaments having a diameter of between about 0.010 inches and about 0.50 inches. It is important to the fused deposition process that the diameter of the filaments be uniform along their length, with diameter variations of ±0.001 inches or less being particularly preferred. Desirably, these filaments may be wound in continuous lengths on a spool for use as the feedstock in the fused deposition forming process. Preferred filaments will have sufficient flexibility that they may be wound in a smooth curve on a spool without breaking, and sufficient compressive strength that they do not buckle or otherwise overtly deform by compressive forces as they are fed into the dispensing head during the fused deposition forming process.

Figure 3:
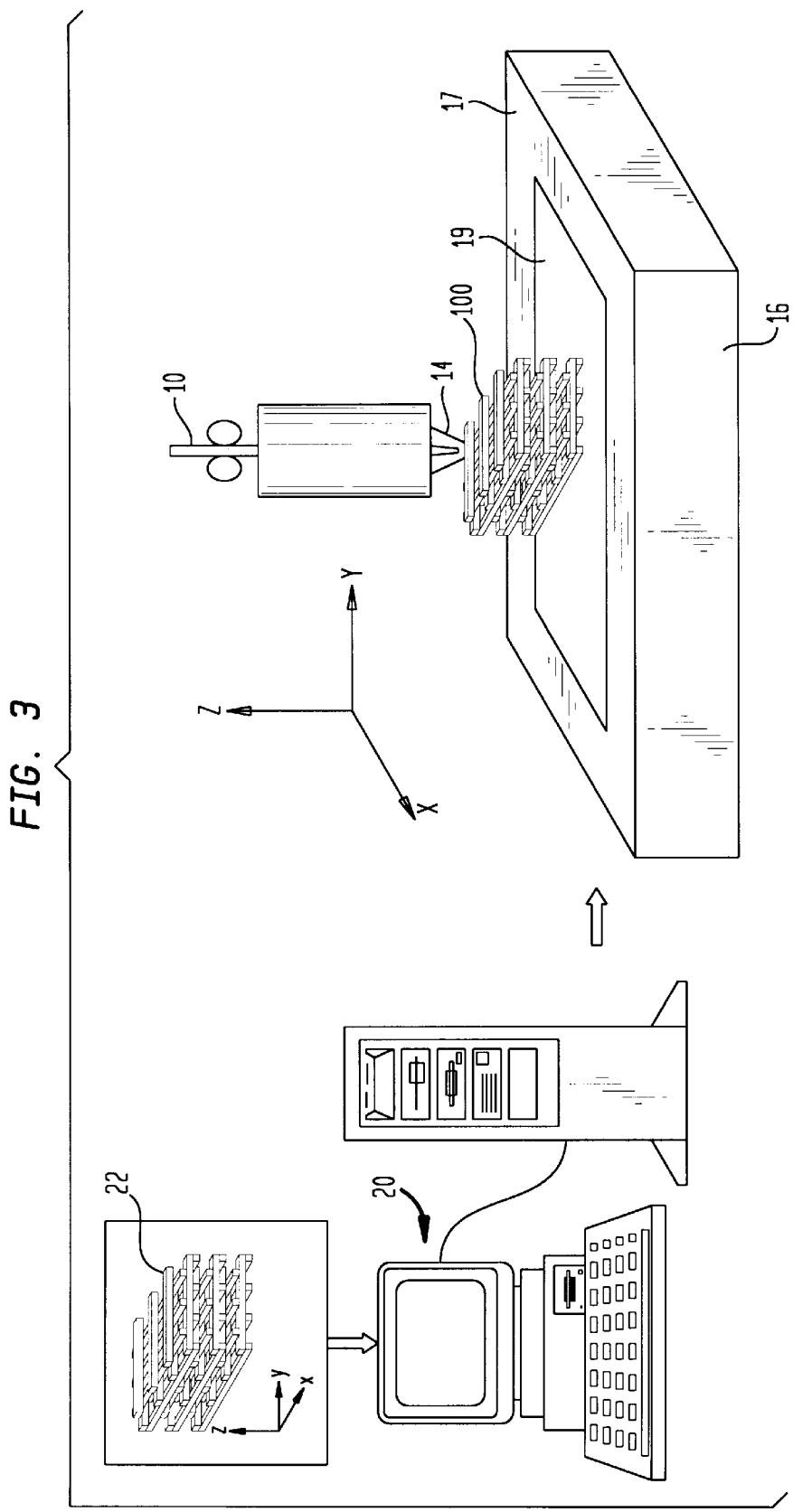
FIG. 3 is a diagrammatic view showing the step of fabricating a photonic bandgap device directly using a fused deposition modeling technique.

A fused deposition forming step which may be used to fabricate photonic bandgap device 100 in a direct forming method in accordance with the present invention is shown diagrammatically in FIG. 3. According to the process, a flexible filament 10 is fed from a supply spool (not shown) into and through the dispensing head 14 of a fused deposition apparatus. Dispensing head 14 is positioned in close proximity to the build platform 16 on which the photonic bandgap device 100 is to be built. Dispensing head 14 and build platform 16 are supported in a conventional manner for movement relative to one another along the "X," "Y" and "Z" axes as shown. Thus, dispensing head 14 may be mounted in a known fashion for movement in a plane defined by the X and Y axes, with build platform 16 supported for separate movement toward and away from dispensing head 14 along the Z axis. Alternatively, build platform 16 may be supported for movement in the plane defined by the X and Y axes, with dispensing head 14 mounted for separate movement along the Z axis toward and away from build platform 16. It will be appreciated that movement in the X-Y plane need not be limited to movement in orthogonal directions, but may include movement in radial, tangential, arcuate and other directions in the X-Y plane. The separate movement of dispensing head 14 and build platform 16 in the X, Y and Z directions may be effected by any of the mechanical drive systems well known in the art. These drive systems preferably are driven by high resolution reversible stepper motors, although other types of drive motors may be used, including linear motors, servomotors, synchronous motors, D.C. motors and fluid motors.

The drive systems preferably are controlled by drive signals generated from a computer 20 running a custom or commercially available solid freeform fabrication program. Utilizing such program, a desired photonic bandgap structure 22 may be inputted to computer 20. The desired structure then may be sectioned into multiple layers by a commercially available software program to provide data corresponding to the particular shape of each individual layer. The layering data signals may be directed to a machine controller (not shown) which selectively actuates the motors for driving dispensing head 14 and build platform 16 in the X, Y and Z directions, respectively, depending upon the layering data signals received.

As filament 10 passes through dispensing head 14, it is heated to a predetermined temperature above its melting point which is selected so that the feedstock material will solidify very rapidly upon cooling after discharge onto build platform 16. It will be appreciated that the solid particulate materials in filament 10 do not melt at the melting point. Thus, as used herein in connection with a feedstock material consisting of particulate materials dispersed in a binder system, the term "melting point" of filament 10 refers to the temperature at which the binder system components in filament 10 are substantially melted so as to place the overall composition of the filament in a fluid state in which it flows outwardly from the outlet of dispensing head 14 onto the surface of build platform 16. Of course, where filament 10 incorporates a thermosetting, water soluble or organic solvent soluble binding system, filament 10 need not be heated.

The size and shape of the dispensing head outlet may be varied depending upon the particular application, as by using interchangeable nozzles having different orifice sizes and shapes, or interchangeable orifice inserts in the tip of the nozzle. Nozzles having round, oval, square, rectangular, oblong or any other cross-sectional shape may be used depending on the particular application. Also, a variable size orifice of the type employed in cameras for varying the aperture could be utilized. The volumetric rate at which the material is dispensed from dispensing head 14 onto build platform 16 thus will be determined by a combination of the preselected orifice size and shape of the dispensing head outlet, as well as by controlling the rate at which the flexible filament 10 is advanced through the dispensing head.

As filament 10 is heated in dispensing head 14 to a fluid state, the solid particle filled fluid material is metered at a controlled flow rate onto the receiving surface 17 of build platform 16. Receiving surface 17 preferably includes a substrate 19 on which the photonic bandgap device 100 is actually built, which substrate minimizes localized shrinkage in the foundation layer of photonic bandgap device 100 and permits the formed device to be released from build platform 16 without damage. One preferred substrate material is a relatively fine, wire mesh sandpaper such as Norton No. 47650-4. Forming the wire mesh from an electrically conductive material, such as copper wire, permits a low voltage current to be applied to heat substrate 19 slightly to facilitate the separation of device 100 therefrom. Alternatively, substrate 19 could be made from a water soluble wax which could be dissolved and easily separated from device 100 without damage; from polytetrafluorethylene (PTFE); from a low density foam which easily can be cut or dissolved away from the article, such as a foam available from Stratasys, Inc. under the name Foundation Foam; or from other such substances.

As indicated in FIG. 3, the drive signals generated from computer 20 selectively move dispensing head 14 and build platform 16 with respect to one another in a predetermined pattern as the feedstock material is being dispensed so as to build up multiple layers of the material and form a photonic bandgap device having the desired three-dimensional structure. Multiple passes of dispensing head 14 are made, with each pass taking place in a controlled pattern dictated by the layering software. The computer and related software programs determine the on and off conditions of the various motors controlling the movement of dispensing head 14 in the X-Y plane, the movement of build platform 16 in the Z direction, and the advancement of filament 10 through the dispensing head. Each of these motors may be operated separately, or one or more of them may be operated simultaneously depending on the shape of the device to be formed. Dispensing head 14 is initially positioned at a predetermined height above build platform 16 or substrate 19 to form the first layer. The height of each subsequent layer is then closely controlled in order to dispense and form very thin layers. By making the deposited layers as thin as possible, the outer surface of the resultant device may be formed with a substantially smooth surface, and, as will be appreciated from the discussion below, precise transitions between the lattice and matrix phases may be achieved. Layers as thin as 0.001 inches may be deposited. The layers may be deposited in a horizontal plane, a vertical plane, or in a plane oriented at any angle with respect to the horizontal plane. Normally, dispensing head 14 will be mounted along the Z axis generally perpendicular to the receiving surface 17 of build platform 16 which extends in the X-Y plane. Deposition of the material may take place along any of the three axes.

When forming and building up multiple layers, the initial relative movement of build platform 16 and dispensing head 14 preferably will be in a horizontal plane defined by the X and Y axes. In a typical scenario, the feedstock material may be dispensed in parallel roads by moving dispensing head 14 back and forth relative to build platform 16 in a predetermined pattern of one or more continuous or discrete raster segments. The roads in the first layer may be oriented in a first or X direction with a predetermined gap deliberately formed between each road, every two roads, or any other periodicity to form the first layer with the desired structure. The first layer solidifies as it cools below the melting points of the binder components and adheres to substrate 19. Upon completion of the deposition pattern in a layer, dispensing head 14 may move away from the layer by a predetermined layer thickness in the Z direction. The process may then be repeated to form a second layer on top of the first layer by depositing parallel roads of the feedstock material, again with a gap deliberately formed between each road, every two roads, or another selected periodicity to form the second layer with the desired structure. Preferably, no material is dispensed onto a previously formed layer until that portion of the layer under dispensing head 14 has solidified. The roads in the second and subsequent layers may be deposited in the same direction as in the first layer, either directly on top of the underlying road or offset therefrom to lie within the interstice between adjacent underlying roads, so as to form a structure having elongated holes extending therethrough in a single direction, if desired. Alternatively, the roads in the second layer may be deposited perpendicular to or in any other direction transverse to the roads in the first layer. Subsequent layers may be deposited in an alternating pattern of the first and second directions to form a structure having elongated holes extending therethrough in two directions. In another variant, the roads in the third layer may be deposited in a third direction, with subsequent layers deposited in an alternating pattern of the first, second and third directions to form a structure having an elongated pattern of holes extending therethrough in three directions, and so forth. Thus, multiple layers may be formed one on top of the other, with the roads and, therefore, the gaps in each layer oriented in any number of directions to form the desired hole pattern in the structure. The flexibility of the process enables the diameter of the roads and the diameter of the gaps to be varied as desired within a wide range of size scales.

In still another variant, the deposition process may be performed so as to form a pattern of elongated holes which are oriented in the structure in the X, Y and Z directions. In such process, the feedstock material is dispensed layer by layer, as described above, with gaps oriented in the X and Y directions to form elongated holes extending through the structure in the X and Y directions. In addition, each layer is formed with one or more voids having the cross-sectional shape of the elongated holes which are to extend in the Z direction. Ordinarily, a periodic array of such voids would be formed in each layer according to the pattern in which the holes are to extend in the Z direction. Each layer would then be deposited with the same pattern of void spaces aligned above the void spaces in the preceding layer, such that the Z direction holes are built up in the structure layer by layer.

Each layer of material is dispensed in a fluid state, solidifies and adheres to the previous layer. This forms a strong bond between layers. When utilizing a dispensing head with a discharge nozzle having a flat bottom surface, the flat bottom surface of the nozzle produces a "doctor blade" effect as dispensing head 14 and build platform 16 are moved relative to one another in the horizontal X-Y plane. The tip of the dispensing nozzle may define the top of each layer by contacting the layer as it is being dispensed, and may thus assist in maintaining each layer at the predetermined layer thickness. Alternatively, a separate squeegee, roller, doctor blade or milling head can be used to define the top of each layer, and thus the layer thickness. The multiple layers may be of uniform thickness or may vary in thickness as necessary and appropriate for forming a particular article. Also, the layers may each vary in thickness across the height of each layer.

Preferably, the melting point of the feedstock material is such that the deposited layer will solidify rapidly at the build environment temperature and at the thickness in which it is dispensed. Where the feedstock material does not solidify rapidly upon being dispensed because of the relatively low melting temperature of the feedstock material or because of the relative thickness of the dispensed layer, then the dispensed layer may be cooled by conventional techniques either directly or through build platform 16. Regardless of the technique used, any cooling operation must be carefully controlled to prevent defects such as shrinkage distortion, poor layer-to-layer bonding, cracking, etc.

It will be appreciated that where the feedstock material incorporates a thermosetting, water soluble, or organic solvent soluble binder system, the solidification of the feedstock material from the fluid state may not involve a cooling step. Rather, solidification may occur through other mechanisms, including gelation, evaporation, curing, heating or chemical reaction.

Particular care must be exercised in depositing the layers so as to eliminate internal defects in the formed article. Internal defects such as voids, cracking and delaminations may arise from several different sources. Internal voids may result from variations in the width and thickness of the roads as they are being deposited. That is, where there is a localized decrease or increase in the width or thickness of a road, two adjacent roads may not contact one another along their entire lengths, leaving a void space between them. Variations in the road width or thickness may be caused by inconsistent material flow which, in turn, may be due to slippage in the filament feed mechanism or to variations in the cross-sectional dimensions of the feedstock filament. Voids resulting from variations in the road width or thickness therefore may be minimized or eliminated by careful control of the cross-sectional dimensions of the feedstock filament and the feeding mechanism. In addition, these voids may be minimized by localized heating or cooling of the substrate to control shrinkage, the formation of localized sinks, and other defects which may arise as the feedstock material solidifies. These defects can also be addressed by altering the layering data signals to include a negative gap in the position of the road being deposited so that the roads move closer together in partially overlapping relationship.

Internal delaminations may arise when adjacent roads do not bond to one another. This is particularly problematic when depositing roads along long vector lengths, wherein the time delay between the deposition of two adjacent roads is high. This time delay results in a large temperature decay in the previously deposited road, such that there is poor adhesion between the adjacent roads. This poor adhesion in the "green" or undensified article may lead to delaminations during the binder removal and/or densification steps discussed below. The occurrence of this defect may be reduced by improving inter-road adhesion through the optimization of the tackifier component in the binder system, through localized substrate heating to retard the temperature decay in the deposited road, or through a redefined deposition pattern.

Still other defects may occur when the internal or external contour of the layer to be deposited does not permit a continuous deposition pattern to be used, such as where a transition from the matrix material phase to the lattice material phase is to occur. As a result of segmenting the deposition pattern, an error may be caused along the "knit" or joining line between one segment and another. These knit lines frequently lead to cracking problems during binder removal and densification. This problem can be minimized by carefully designing the deposition pattern to eliminate the need for multiple deposition segments in a single layer. The problem may also be reduced by locally heating the substrate or increasing the deposition rate so as to ensure good adhesion between the segments at the knit line.

Following its formation by the fused deposition process, photonic bandgap device 100 may be processed to improve its surface finish. Such processing may include machining of the surface by sanding, grinding, vibrating in an abrasive media, and other techniques known in the art. This machining step may take place while the article is in the "green-"state prior to binder removal, with the article in the "bisque" state prior to densification, after densification, or at a combination of these stages. Rather than mechanical machining, the article may be treated with a solvent to improve its surface finish. Also, a machining step may be performed on a layer by layer basis during the fused deposition forming process. Furthermore, device 100 optionally may be subjected to a post fabrication treatment such as cold isostatic pressing or warm isostatic pressing to facilitate the removal of any residual internal voids, delaminations or other defects.

Subsequent to any green machining operation, device 100 may be processed to remove at least a portion of the binders therefrom. Binder removal may be accomplished by various techniques, including solvent extraction, supercritical fluid processes, thermal processes and combinations thereof. One preferred binder removal technique is a thermal processing step in which the device is gradually heated according to a predetermined time-temperature schedule. The parameters of this thermal processing or "binder burnout" cycle will, of course, depend upon the particular formulation of the binder system and the formulation of the particulate material therein. Other factors influencing the binder burnout cycle include the relative proportion of the binder in the device, the proportion of the binder to be removed, the cross-sectional size and shape of the device, and the physical and thermal properties of the solid particles therein. The development of appropriate burnout cycles are conventional, for example, to those skilled in the art of injection molding of ceramics or metals.

In a typical binder burnout cycle, the device may be slowly heated in an effort to cause the components of the binder system having the lowest melting point to initially soften and flow out of the device through capillary action. This creates channels within the device which facilitate the removal of the binder from the interior of the device, as well as the removal of the binder components having higher melting points. The removal of the binder from the device through capillary liquid transport may be enhanced by completely or partially embedding the device in a setter filled with an inert, thermally stable setter powder such as alumina or carbon. After removal of the binder through capillary liquid transport has proceeded to a certain extent, the temperature may be gradually increased, whereupon the components of the binder may begin to thermally decompose and be removed from the device by diffusion and evaporation. The binder burnout cycle may be conducted in an inert atmosphere, in an oxidizing atmosphere, in a reducing atmosphere, in a vacuum or under high pressure depending on the binders being removed, the amount being removed, the composition of the particulate materials in the device, etc.

Binder burnout may take place in a continuous cycle, or may include one or more cooling phases defining individual stages of the cycle. The development of the appropriate binder burnout cycle is critical since too rapid a rate of binder removal frequently results in the generation of defects within the device. Such defects include, for example, bloating, blistering, surface or internal cracking and delaminations.

Following the binder removal step, the device optionally may be subjected to a densification step. Densification may be accomplished in many ways, including thermal treatment, hot pressing, hot isostatic pressing, reaction bonding, directed metal oxidation, reaction infiltration, chemical vapor deposition and combinations thereof. In a preferred densification procedure, the device may be sintered according to a preselected time-temperature schedule to bond the particles therein together and to develop the final properties of the device. Again, the time-temperature profile of the sintering step will depend upon the compositions of the solid particles in the device and the properties desired to be obtained. Generally, more refractory or thermally stable particulate materials must be sintered at higher temperatures and/or for longer times to develop higher strength and density.

Rather than sintering to densify the device after the binder removal step, the device may be "bisque" fired to a relatively low temperature to bond the particles together sufficiently for the device to be handled without breaking. The bisque fired device may then be used as is, or may be further processed as desired, for example, by infiltrating its pores with a metal, polymer, glass, ceramic solution or the like.

The sintering step may yield the desired photonic bandgap structure, or further processing may be required. For example, where the resultant structure is in the form of a matrix phase having unfilled holes extending through it in a periodic array, these holes may be left empty, or may be filled with a second material having a dielectric constant or index of refraction significantly different from that of the matrix phase. Conversely, the process may yield a periodic array of solid material with the matrix phase consisting of air, as is the case with photonic bandgap device 100. In such case, the periodic array may be placed in an outer mold and infiltrated with a material having a significantly different dielectric constant or index of refraction, such as a polymer, for the purpose of altering the photonic bandgap properties of the structure, reinforcing and strengthening the structure, etc.

It will be appreciated that innumerable modifications may be made to the direct fused deposition forming process. For example, as noted above, rather than be in the form of continuous filament 10, the feedstock material may be supplied to the dispensing head 14 of the fused deposition apparatus in a fluid state, such as where a feedstock composition incorporating a thermoplastic binder system is supplied to the dispensing head at a temperature above its melting temperature; in the form of a granulated solid; or in the form of a solid rod, bar of filament of finite length. Regardless of the form in which the feedstock material is supplied to dispensing head 14, the supply mechanism must be capable of careful control so that the volumetric dispensing rate of the feedstock material can be controlled accurately.

In addition to dispensing head 14, the fused deposition process can be carried out using other types of apparatus known in the art, provided that dispensing through that apparatus can be controlled accurately. Such apparatus may include, for example, conventional piston or plunger types of dispensing mechanisms, highly controllable screw-type feeders, and the like.

Also, the fused deposition process may be arranged so that multiple and different feedstock materials can be dispensed either alternately through a single dispensing nozzle, or alternately or simultaneously through multiple dispensing nozzles. Methods for dispensing multiple and different feedstock compositions may be designed to dispense a composition having one dielectric constant from one nozzle to form the matrix phase of the photonic bandgap structure, and to dispense a composition having a different dielectric constant from another nozzle to form the periodic array of the photonic bandgap structure. Where the matrix phase or periodic array is to be formed from more than one composition, a separate nozzle may be provided for dispensing each such composition.

Furthermore, where the periodic array of the final structure is to consist of unfilled holes or air gaps extending through the structure, the gaps may temporarily be filled with an unfilled binder, such as wax, as each layer is deposited. This binder would support the roads as they are deposited across the gap regions in the underlying layers. Thus, each layer may be deposited as a solid layer with no unfilled gaps so as to completely support the next adjacent layer deposited thereon. The wax may then be removed from these regions by solvent extraction, melting, vaporization or any other binder removal process which does not affect the matrix phase to yield the desired hole pattern.

In a still further variant of the direct process described above, the particulate material may be mixed with a binder which is not subsequently removed. That is, a particulate material may be added to a polymer in order to create a composite having a desired dielectric constant. This composite may be deposited using a fused deposition process to define the periodic array of holes in the photonic bandgap structure. The composite structure may then be infiltrated with a polymer, either filled or unfilled but having a significantly different dielectric constant, to form the matrix phase encapsulating the periodic array defined by the composite. Similarly, the composite may be used to define the matrix phase of the photonic bandgap structure, and the array of unfilled holes may be left unfilled or infiltrated with a polymer having a significantly different dielectric constant. In either event, the polymer would not be removed from the composite subsequent to part fabrication, and no sintering step would be required.

The fused deposition process allows the array of holes to be formed in any desired pattern, including the formation of blind holes which extend as a series of dashes through the matrix phase, or the formation of holes which change direction within the matrix phase. The process also allows for the introduction of random and non-random "defects" into the photonic bandgap structure as desired. Furthermore, the process permits parts to be formed with gradual or abrupt changes in composition from one layer to the next or from one portion of a layer to another, thereby enabling such variations as a pattern of holes with a different composition in one direction than in another direction, a matrix phase with different compositions in selected regions, etc.

Fused Deposition Modeling—Indirect Method

The fused deposition process may also be used in an indirect method for forming photonic bandgap structures. Typically, such methods deposit an unfilled flowable material, such as wax, polyethylene, polypropylene, ABS plastic or other thermoplastic or thermosetting polymer or water soluble or organic solvent soluble mixture, to form a mold from which the photonic bandgap structure may be formed from a desired composition. The actual deposition steps, however, are typically the same as described above for depositing a filled binder. In such processes, a single unfilled substance may be deposited to occupy either the latticework phase or matrix phase of the photonic bandgap structure, with the other phase being left unfilled. Alternatively, two materials may be deposited as each layer of the structure is formed, one material occupying the latticework phase of the structure and the other material occupying the matrix phase of the structure. In this latter scenario, the deposited materials are desirably of substantially different compositions so that, once the deposition process has been completed, one of the materials may be removed by thermal, chemical or other such treatment without disturbing the other material. This procedure enables the formation of undercuts in the structure which otherwise would be unsupported, and provides a greater degree of structural integrity during and after the fabrication process.

In one such indirect method, the process may be used to form a latticework which may then serve as a mold to define the hole pattern to be formed in the final photonic bandgap structure. In this method, the latticework would be placed within a mold or shell defining the outside surface of the structure. The fused deposition process may be used to form this outside shell as well by first depositing roads of a material for forming the outside shell adjacent to one another to form an initial solid layer. Each subsequent layer would then be built on top this first solid layer, with each layer including a perimeter road of the shell material and regions of the latticework, such that the outer shell will be built layer by layer as the latticework is formed.

In any event, once the latticework and shell or mold have been integrally formed together or assembled, a slurry incorporating the desired dielectric material may be cast, poured, injected or otherwise infiltrated into the mold to form a matrix phase around the latticework. The outer mold may then be removed from the part by mechanical, chemical or thermal means. However, there may be instances where the outer shell, formed from an appropriate material, would be left in place and form a permanent part of the final photonic bandgap structure. The material forming the latticework may be removed from the matrix phase by subjecting the part to heat, solvent extraction, acid or caustic leaching or other mechanism which will not disturb the matrix phase. Once the material forming the latticework has been removed from the holes, the holes may or may not be filled with a second material having a dielectric constant or index of refraction significantly different from that of the matrix phase. Alternatively, where the latticework has been formed from a material which is to constitute the hole pattern in the photonic bandgap structure, the latticework material would not be removed from the matrix phase. After the part has been formed, no further treatment may be needed, or the part may be subjected to a partial or complete binder removal step, a partial sintering step, a full sintering step, an impregnation step to fill the holes with a desired material, etc.

The formation of the slurry system for filling the mold in accordance with this indirect process will be influenced by several factors; it should exhibit good flow properties during casting, be stable under the mixing and casting conditions, and be compatible with the mold material such that no evolution of gases occurs during casting, gelling or drying and so that it does not dissolve or otherwise attack the material from which the mold has been built. The term "casting" is used herein in its broad sense to refer to pouring the slurry into the mold, and includes slip casting where the mold is porous, as well as pouring the slurry into a nonporous mold where solidification is by chemical reaction, cross-linking, etc.

The slurry may be prepared by incorporating one or more solid particulate materials with a fluid solvent to form an aqueous, nonaqueous or aqueous polymer-based suspension. Solvents for forming the slurry include water, a suspension of a polymer in water, or any fluid hydrocarbon, such as ethanol, acetone, hexane, methanol and the like, provided that the solvent, when combined with the other components of the system, produces a sufficiently low viscosity to be cast into and fill the mold.

The particulate materials for the slurry may be in the form of powders, platelets, granules, whiskers, discontinuous or continuous fibers, or combinations thereof. The amount of particulate materials in the slurry will depend upon the desired bulk density of the article being produced. For low density applications, the particulate materials may constitute at least about 5 volume percent of the slurry. For forming higher density articles, including articles that are fully dense, the particulate materials may constitute at least about 40 volume percent, and more preferably, at least about 50 volume percent of the slurry. Still more preferably, the particulate materials may constitute between about 55 volume percent and about 75 volume percent of the slurry. The particulate materials may be selected from the same group of solid particulate materials described above in connection with the fabrication of feedstock materials for use in the direct fused deposition methods, including ceramic materials, elemental metals, metal alloys, steels, cermets, semiconductors, polymers and combinations of these materials.

The physical properties of the particulate materials employed in the slurry compositions will be dictated largely by the particular material being used, the properties being sought in the photonic bandgap device, and the intended use of the device being produced. Selection of an appropriate particle size distribution is particularly important so that the desired level of solids, either low or high, may be loaded into the solvent while maintaining the desired level of flowability of the slurry such that it can readily be cast into and completely fill the mold. Also, the size of the largest particles in the distribution should be substantially smaller than the diameter of any of the gaps in the mold structure so as to avoid any clogging of the structure which would prevent the suspension from fully filling the void space in the mold. The maximum particle size preferably should be no more than one-fourth of the minimum gap or opening size in the mold structure. There is no minimum particle size, the invention contemplating the use of nanoparticles or nanoscale particles either alone or in combination with particles in a larger particle size range. Similarly, the particulate material may have anywhere from a very narrow to a very broad particle size distribution. A preferred particle size distribution would inhibit settling or separation of the particulate materials in the slurry and would promote densification during the sintering step, where applicable.

Desirably, the particulate materials may be mixed with a dispersing agent which modifies the cohesive forces between the particles and the other components of the slurry, including the solvent, thereby enhancing the dispersion of the particles within the slurry system, lowering the viscosity of the system to enable a higher solids loading if desired, and improving the overall flow characteristics of the slurry so as to facilitate the complete filling of the mold with the slurry. Dispersing agents may be selected from the group consisting of dispersants or surfactants, coupling agents specific to the material being dispersed, and combinations thereof. Preferred dispersing agents for use in aqueous slurries include glycerin, sodium silicate, ammonium polyacrylate and other such agents known in the art. Preferred dispersing agents for use in nonaqueous slurries include stearic acid, oleic acid, polyethyleneimine, stearyl alcohol, menhaden fish oil and other such agents known in the art. Polymethylacrylate is a preferred dispersing agent for use in an aqueous polymer-based slurry. Preferably, between about 0.1 volume percent and about 20 volume percent of the dispersing agent (based upon the volume of the particulate materials) is added to the system. More preferably between about 0.1 volume percent and about 10 volume percent of the dispersing agent is added, and most preferably between about 0.1 volume percent and about 5 volume percent of the dispersing agent is added to produce an approximate surface coverage of one monolayer on the particles. Prior to its addition to the particulate materials, the dispersing agent may be dissolved in an appropriate solvent (which may be the same as or different from the solvent for forming the slurry). The dissolved dispersing agent may be intimately combined with the particulate material using conventional mixing techniques, following which the solvent may or may not be removed from the mixture.

The slurry may also incorporate a polymer material such that once the slurry has been cast into the mold, and the polymer has been cured either by gelation, thermal treatment or chemical treatment, or the solvent has been removed by evaporation, the remaining polymer may act as a binder, giving the photonic bandgap structure mechanical strength for handling after the removal of the mold. Desirably, the binder will impart sufficient strength to enable the "green" photonic bandgap device to be handled and processed through a binder removal step, where applicable, as well as a sintering step, also where applicable, without deformation, cracking, breakage, etc. Preferred binders exhibit low viscosity and Newtonian behavior (but possibly shear thinning behavior during casting), such that when highly loaded with particles, the slurry system has as low a viscosity as possible to facilitate its flow into the small or large cavities in the mold. Such binders may be selected from among any group of binders that are used conventionally in the ceramic or powder metallurgy die pressing, slip casting, tape casting, gel casting or injection molding processes, including, among others, polyvinyl butyral, polyethylene acetate, methylcellulose, paraffin waxes, microcrystalline waxes and combinations thereof. Preferably, the binder comprises between about 1 volume percent and about 50 volume percent of the non-particulate component of the slurry, i.e., the binder and the solvent.

Once the solid particulate materials, solvent, surfactant, dispersant and binder have been selected, these materials are mixed together to form a homogenous suspension. This may be done by high shear mixing techniques standard in the powder metallurgy and ceramic industries, such as ball milling, attrition milling, roll milling, impeller mixing, Brabender mixing, etc., to form a substantially homogeneous mixture with a minimum of agglomeration. Proper mixing is important since failure to deagglomerate or evenly distribute the particulate materials within the slurry may result in nonuniform shrinkage, cracking, warping, delamination or the introduction of strength-limiting flaws in the article being produced. Also, improper mixing may give rise to undesirable optical defects in the final photonic bandgap device. The slurry may be filtered through a screen or other mechanism to eliminate any debris, agglomerates or large particles therein which may obstruct the complete filling of the mold.

After the slurry has been prepared to the desired level of homogeneity, it may be subjected to a vacuum or other treatment to eliminate undesirable air which may create bubbles or other defects which would jeopardize the mechanical and optical integrity of the photonic bandgap device. Conversely, there may be situations in which an agent is added to the slurry which would intentionally generate gas bubbles during or subsequent to the casting step but prior to solidification. Such bubbles may be useful in lowering the index of refraction of the solid phase of the photonic bandgap structure.

Once completed, the slurry may be poured, cast or injected into the mold to completely fill the cavities therein. Optionally, an excess amount of the slurry may be cast to form a base at one end of the mold such as, for example, to interconnect at one end a plurality of parallel cast structures so as to maintain the integrity of the overall structure during processing after mold removal, to add mechanical strength to the structure, etc. The casting step may be performed at atmospheric pressure where gravity or surface tension causes the slurry to fill the mold cavities, or under vacuum or positive pressure to facilitate the infiltration of the slurry throughout the mold cavities. After the suspension has been cast into the mold, which could take from a few seconds to several hours, the filled mold may be treated to solidify the slurry. Solidification may occur through cooling, such as where the slurry incorporates a thermoplastic material which substantially solidifies on cooling, or for an agar-based system which may gel on cooling. Solidification may occur through heating, for example, such as with slurries incorporating methylcellulose-based materials. Solidification may also occur through chemical reaction, for example, where the slurry incorporates a monomer and an activating agent which causes the monomer to cross-link and form a three dimensional network. Solidification can also occur through a conventional drying mechanism as is well known in the ceramic slip casting art.

The solidified composition within the mold may have the desired properties in the as formed state and thus may be used without further processing. That is, the cast material, once solidified, may have a dielectric constant or index of refraction which is substantially different from the dielectric constant or index of refraction of the mold material such that no further processing may be required for the photonic bandgap structure to be used for its intended purpose. However, the mold/cast composition may be further processed together. For example, the mold for the photonic bandgap structure may be designed so as to be significantly larger in one, two or three dimensions than the photonic bandgap device ultimately desired. Using conventional machining operations, the mold/cast composition may be cut into a plurality of smaller mold/cast composition devices having the same internal structure as the larger device. These smaller devices may be used without further processing or each individual device may be further processed as described below.

The mold/cast composition may be processed to remove part or all of the mold material, yielding the photonic bandgap structure in a green or as cast state. Mold removal may be accomplished by various techniques, including solvent extraction, supercritical fluid processes, thermal processes or combinations thereof, depending upon the material from which the mold is made and the material forming the photonic bandgap structure, and particularly the binder component thereof. Preferred binder removal techniques will remove part or all of the mold material, as desired, without attacking, deforming or otherwise damaging the photonic bandgap structure therein.

Once the mold has been removed, the photonic bandgap structure may have the desired properties for use in its green state, or it may be subjected to further processing to improve its properties. In addition to any desired green machining operation to improve its overall external surface or to change its external geometry, the photonic bandgap device may be processed to remove any binders, for example, by a carefully controlled heating schedule such as described above, solvent extraction or the like, and may then be densified, such as by sintering to develop the desired mechanical strength in the part as well as the desired index of refraction. Rather than complete or almost complete densification, the part may be partially densified to leave a substantial pore volume in place, and then impregnated to fill the pore volume with another material, such as a metal, polymer, sol-gel ceramic, etc., yielding a photonic bandgap device having a composite index of refraction. The resulting photonic bandgap structure may be used as is, i.e., with one phase consisting of the particulate or composite composition and the second phase consisting of air. Alternatively, the second phase could be filled with a second solid material having a substantially different index of refraction than the first phase. This second material may be infiltrated into the open space in a liquid, solid particulate or other physical form using any well-known technique, and may be added prior to the binder removal and/or densification steps discussed above. That is, both phases of the photonic bandgap structure may be subjected to the binder removal and/or densification steps simultaneously. Of course, it will be appreciated that where the second material is a liquid or polymer, it may be added subsequent to the binder and sintering steps.

In a variant of the indirect method described above, the fused deposition process may be used to deposit an unfilled substance to form the matrix phase, with gaps between the roads defining the location of the pattern of holes extending through the structure. This matrix phase may then serve as a mold in which the gaps may be filled with a slurry incorporating an appropriate material to define the periodic array of holes through the structure. The unfilled substance defining the matrix phase may then be removed as described above to yield a latticework of the cast material in the desired array. The latticework may then be left untreated, subjected to a partial or complete binder removal step, subjected to a partial or full sintering step, infiltrated with a material having a substantially different dielectric constant or index of refraction to fill the matrix phase around the latticework, etc. in order to achieve the final desired properties of the photonic bandgap device.

Stereolithography—Indirect Method

Another solid freeform fabrication method for forming photonic bandgap structures in accordance with the present invention employs stereolithography to form a three-dimensional part from a laser-curable liquid either with or without a particulate material dispersed therein. Stereolithography processes are described in U.S. Pat. No. 4,929,402, the disclosure of which is hereby incorporated by reference herein.

In an overview of an indirect stereolithography process, the layering signals from the CAD software control the movement and focus of a laser beam to selectively polymerize regions of a photopolymerizable liquid at the surface of a bath of the liquid so as to form a mold for a photonic bandgap device layer by layer. Once the mold has been formed, it may be filled with a slurry of the desired material for forming the photonic bandgap device. In this regard, the same slurries as described above for filling the molds formed by the fused deposition technique may be used.

The stereolithography process utilizes a liquid bath of a photopolymerizable solution consisting at least of a monomer and a photoinitiator which reacts with ultraviolet or other appropriate wavelength radiation to initiate polymerization. Preferred monomers include acrylates, such as acrylamide and diacrylate, and epoxies. A preferred photoinitiator for acrylate monomers is methylenebisacrylamide. These materials may be mixed together in a ratio of about 9 parts monomer to about 1 part photoimitator.

Figure 4:
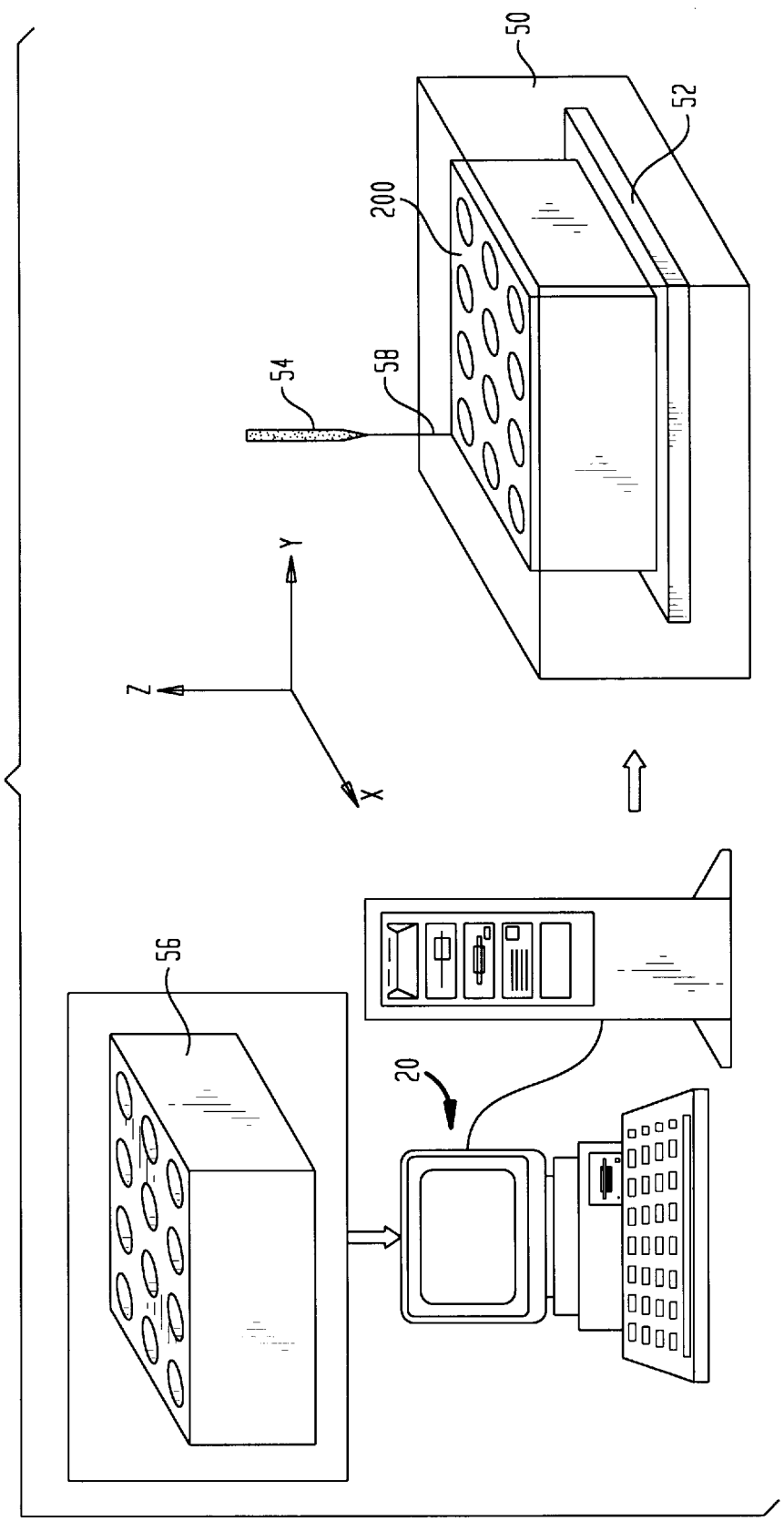
FIG. 4 is a diagrammatic view showing the step of fabricating a photonic bandgap device indirectly using a stereolithography technique.

A stereolithography forming step which may be used in an indirect method for forming mold 200 in accordance with the present invention is shown diagrammatically in FIG. 4. According to the process, a tank 50 is filled with a photopolymerizable liquid. A build platform 52 is initially supported in the tank just below the upper surface of the liquid, and a laser beam 58 from laser 54 is incident upon a mirror (not shown) positioned above the tank. The mirror may be supported to effect movement of the laser beam 58 along the X and Y coordinates. Also, the build platform 52 may be mounted for movement in the Z direction relative to the surface of the liquid. In a typical arrangement, the mirror may be mounted in a known fashion for rotation about an axis extending in the Z direction such that the laser beam 58 incident on the mirror can scan across the surface of the liquid either in a vector mode or in a raster mode. Build platform 52 may be supported using known techniques for separate movement toward and away from the surface of the liquid along the Z axis. Alternative arrangements for moving the laser beam 58 and build platform 52 relative to one another in the X, Y and Z directions are also contemplated herein.

The mechanisms for selectively moving the mirror and build platform 52 and for selectively turning the laser 54 on and off preferably are controlled by signals generated from a computer 20 running a commercially available or custom software program. Utilizing such program, the mold structure 56 for forming a desired photonic bandgap device may be inputted into computer 20. Commercially available software may then be used to section the mold structure 56 into multiple layers, and to develop data signals representing each individual layer. Those data signals may be used to selectively actuate laser 54, rotate the mirror and move build platform 52 upwards and downwards during the fabrication process.

The laser 54 may be any conventional laser capable of supplying a sufficient amount of energy at an appropriate wavelength and an appropriate beam diameter to initiate photopolymerization. Conventional lasers include a 30 milliwatt Argon-ion laser (351 nm) or a 30 milliwatt He-Cd laser (312 nm). A beam diameter of between about 10 microns and about 1000 microns may be used, with a beam diameter of about 250 microns being most preferred. Stereolithography apparatus incorporating an Argon-ion laser is available from 3D Systems, Inc. of Valencia, Calif. as Model SLA-250.

As the laser beam 58 is reflected from the mirror onto the surface of the liquid, the incident energy initiates a process whereby the monomers in the liquid exposed to the laser beam begin to crosslink with one another to form a polymerized solid. The depth of polymerization will depend upon the focal length, diameter and intensity of the laser beam, and may be controlled automatically by the software. The software also controls rotation of the mirror to move the laser beam across the surface of the liquid according to the design criteria for the first layer of the mold. As the beam scans across the surface of the liquid, it forms or "writes" a "road" or path of the polymerized solid. The laser beam may polymerize roads adjacent to one another, with adjacent roads adhering to one another, to form a solid layer. However, where a region within a layer is to define a void in the final mold, the laser beam may be turned off as that region is scanned, or the software may control the mirror so as to not scan that region, such that that region of the layer will not be polymerized, but will remain in a liquid state.

When the first layer has been completed, the laser may be turned off and build platform 52 may be moved downwardly by a predetermined layer thickness. A twin screw adjustable recoater blade (not shown) may then traverse the surface of the liquid to define the thickness of the next layer of unpolymerized liquid above the layer which has already been polymerized. The laser 54 may again be actuated and the mirror rotated to write a second pattern of roads across the surface of the liquid. As the laser beam writes across the surface of the liquid, it causes the liquid in the second layer to polymerize to a solid state and adhere to the first layer. Subsequent layers may be built in a similar fashion, one on top of the other, until the entire mold 200 has been formed.

Following its formation by the stereolithography process, mold 200 may be lifted from the liquid tank and rinsed with a solvent, such as tri-propylene glycolmonoethylether, to remove any uncured liquid monomer from its surface. After this cleaning step, the mold may be subjected to a postcuring step in which the mold is exposed to a radiation source, such as ultraviolet or actinic fluorescent lamps, to fully polymerize the monomer within the mold without excessive heating which could potentially thermally stress the mold.

Once mold 200 has been completed, the cavities within the mold may be filled with a slurry for forming the photonic bandgap device. Preferred slurries include those that have been described above in connection with the indirect fused deposition process of the present invention. The solidification of the slurry and the post-solidification treatment of the cast composition, such as mold removal, binder burnout and sintering, where desired, may be the same as described above.

In a variant of the indirect method described above, the stereolithography process may be used to form a latticework defining the periodic array of holes in the final structure. The latticework may then be placed in a mold or shell which is subsequently infiltrated with a ceramic slurry as described above. In such process, the latticework would define the hole pattern, but would be removed from the cast matrix, and the remaining holes may be left empty or filled with a second material. As with the indirect fused deposition process described above, the stereolithography process may be used to integrally form an outer shell around the latticework by polymerizing the perimeter of each layer of the monomer liquid as the latticework is built up.

Stereolithography—Direct Method

The stereolithography process also may be used in direct methods for forming photonic bandgap devices. In such processes, the photopolymerizable liquid may incorporate a solid particulate material such that polymerization of the liquid will result in a solid composite mixture of the particulate material dispersed throughout the solid polymer. These processes may be used to deposit a periodic latticework defining the photonic bandgap structure, or to deposit the matrix phase, with the gaps between the selectively polymerized regions defining the pattern of holes extending through the structure.

The photopolymerizable suspension may utilize the same liquid solution (i.e., monomer and photoinitiator) as described above in connection with the indirect method. The solution may further include one or more nonreactive solvents to reduce the viscosity of the solution. The selection of an appropriate solvent will depend upon the monomer in the solution, and may include water, alcohol and other solvents well known in the art. The solvent may be present in the solution in amounts of between about 0 volume percent and 80 volume percent based on the total volume of the solution without any particulate materials therein. Preferably, the solution includes between about 40 volume percent and about 80 volume percent of the solvent, and more preferably between about 50 volume percent and about 75 volume percent of the solvent.

The solution may further include a component for altering its index of refraction. For example, water (n=1.33) and ethylene glycol (n=1.43) may be added to the solution in various ratios in order to either increase or decrease the index of refraction of the solution.

The photopolymerizable solution may be mixed with one or more particulate materials to form a suspension for use in the direct stereolithographic methods of the present invention. The particulate materials which may be used in this process are the same particulate materials which may be used in the direct fused deposition processes described above, and may include ceramic materials, elemental metals, metal alloys, steels, cermets, semiconductors, polymers and combinations of these materials which exhibit a dielectric constant, index of refraction and other properties required for the photonic bandgap detector being formed. It should be noted, however, that, for stereolithographic processes, the optical properties of the solid particulate materials incorporated in the suspension should be such that they are transparent or substantially transparent to the incident radiation. Otherwise, scattering or absorption of the incident radiation will minimize the amount of energy that is available for cross-linking the monomer, thereby increasing the polymerization time and reducing the thickness of the layer which can be polymerized.

The amount of the solid particulate material which may be loaded into the solution will depend upon several factors, including the optical properties, density, particle size and particle size distribution of the particulate material and the viscosity of the resultant suspension. Preferably, the suspension will include between about 1 volume percent and about 80 volume percent solids loading; more preferably between about 20 volume percent and about 70 volume percent solids loading; and most preferably between about 40 volume percent and about 60 volume percent solids loading. Optionally, the particulate materials may be mixed with a dispersing agent to enhance the dispersion of the particles within the solution and lower the viscosity of the suspension.

Once the solid particulate materials and the components of the photopolymerizable solution have been selected, these materials are mixed together to form a suspension. Preferably, the solid particulate materials are first mixed with a dispersant using conventional mixing techniques, such as ball milling, either with or without the assistance of a solvent. After removal of the solvent, where that is desired, the particulate material may be screened to yield a free-flowing particulate composition.

The particulate composition may then be mixed with the various components of the photopolymerizable solution, including the monomer and, where applicable, the solvent and the component for adjusting the index of refraction of the solution, but not including the photoinitiator. Leaving the photoinitiator out of the mixture during the initial mixing step avoids premature polymerization of the suspension. Mixing may be accomplished using conventional techniques. Typically, for solids loading of up to about 35 volume percent, mixing may be accomplished using a high speed shear mixer. At higher levels of solids loading, ball milling may be required in order to achieve thorough mixing and homogenization. Once all of the solid particulate material has been incorporated into the suspension, the photoinitiator may be added followed by further mixing to completely incorporate same and form a homogeneous suspension.

Figure 5:
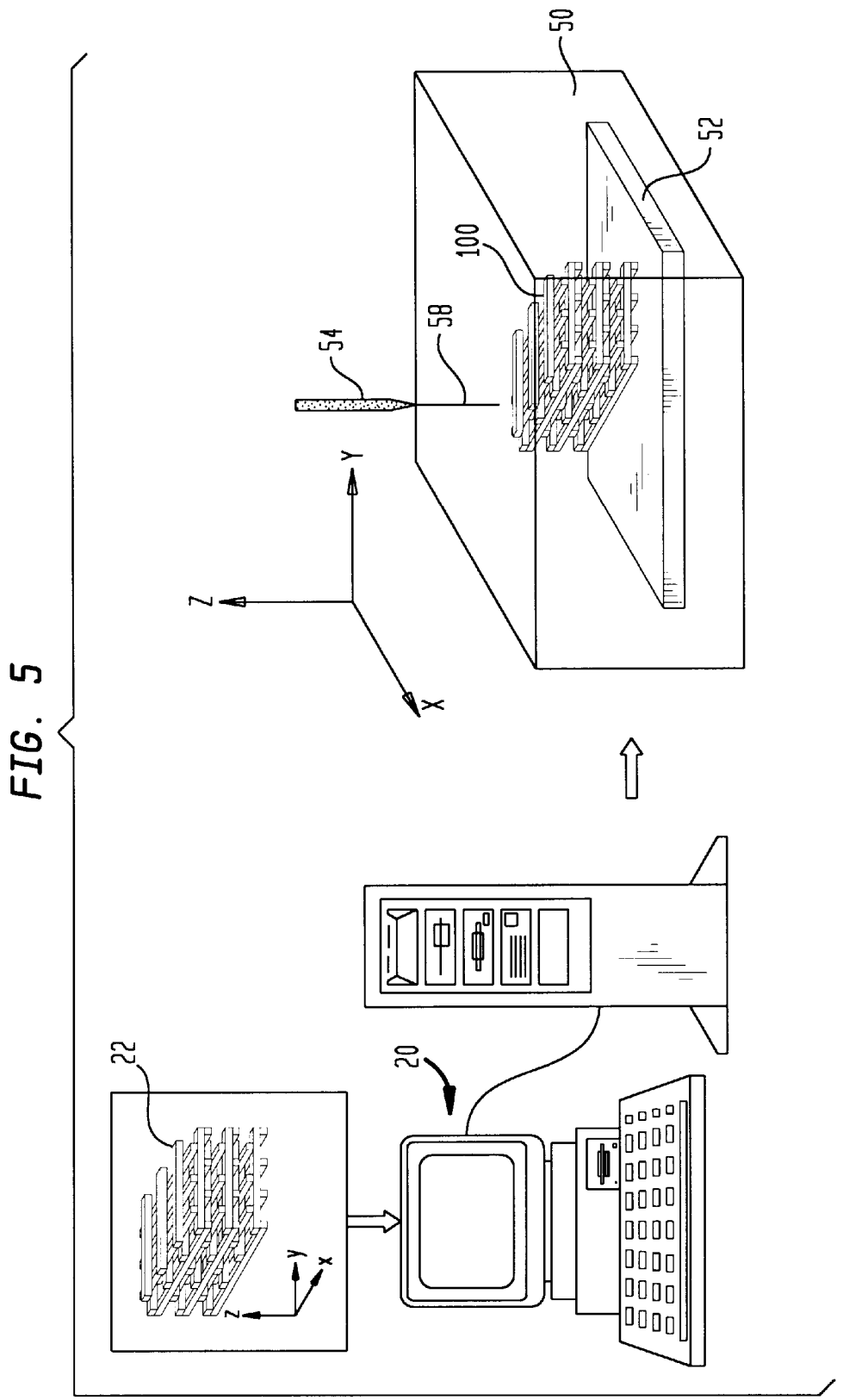
FIG. 5 is a diagrammatic view showing the step of fabricating a photonic bandgap device directly using a stereolithography technique.

A stereolithography forming step which may be used in a direct method for forming photonic bandgap device 100 in accordance with the present invention is shown diagrammatically in FIG. 5. The process is substantially the same as that described above in connection with the formation of mold 200. However, as laser beam 58 is scanned across the surface of the liquid and the liquid polymerizes, it will encapsulate the solid particulate material therein. This polymerized composite may be of a desired composition for forming either the hole array or matrix phase of the photonic bandgap device. Thus, to form the hole array, such as defined by the elongated rectangular bars of photonic bandgap device 100, laser beam 58 may be scanned to form in the first layer a plurality of parallel polymerized regions separated by unpolymerized regions. The next several layers may be formed in the same way on top of the first layer until the first row of rectangular bars in the structure has been formed. In the next several layers, the laser beam may be scanned to polymerize a plurality of parallel spaced apart regions extending orthogonally to the first row of bars until the second row of bars has been formed. The process may then be repeated until the entire latticework of bars defining photonic bandgap device 100 has been formed. The latticework may then be removed from the bath, rinsed in a solvent and processed through a secondary curing operation until fully polymerized. The photonic bandgap device 100 may be used as is, with air as the matrix phase, may be placed in a mold and infiltrated with a material having a substantially different index of refraction to serve as the matrix phase, or may be processed through a binder removal step to remove the polymer component therefrom, sintered to a desired density, etc.

It will be appreciated that, in a variant hereof, the direct stereolithography process may be used to form the matrix phase of the photonic bandgap device, with the unpolymerized portions defining the pattern of holes therein. The pattern of holes may be left empty or may be filled with a material having a substantially different dielectric constant or index of refraction. The matrix phase may also be processed to remove the polymer component, to partially or fully densify the solid particulate component, etc.

The stereolithography process allows the periodic array of holes to be formed in any desired pattern, including formation of holes which change direction within the matrix phase or which change in cross-sectional size from one region of the matrix phase to another. The process also allows the introduction of random and non-random "defects" into the photonic bandgap structure as desired.

Sanders Prototyping—Indirect Method

A further solid freeform fabrication process for forming photonic bandgap structures in accordance with an indirect method of the present invention is similar to ink jet printing techniques, and is commonly referred to as Sanders prototyping. Sanders prototyping processes are described generally in U.S. Pat. No. 5,506,607, the disclosure of which is hereby incorporated by reference herein.

In this technique, one or more thermoplastic materials are held in heated reservoirs associated with a printing head or nozzle. The layering signals from the CAD-based software control the movement and actuation of the printing head which dispenses droplets of the materials in liquid form onto a substrate. The materials may be deposited layer by layer until a mold configured to form a photonic bandgap device with the desired structure has been completely built.

The feed material for the Sanders prototyping process is typically a thermoplastic polymer, most preferably a wax. In preferred arrangements, two thermoplastic polymers may be used. The first thermoplastic polymer, referred to as the build material, may be deposited to build the mold according to the computer generated data. The other thermoplastic polymer, referred to as the support material, may be deposited to temporarily support any undercut regions of the mold during the forming process and to temporarily fill the cavities of the mold, i.e., those portions of the mold which are subsequently to be filled with a slurry to form the photonic bandgap device. Desirably, the two thermoplastic polymers have significantly different melting points so that the support material may be removed from the mold when completed, without melting, softening or otherwise disturbing the build material defining the mold. Rather than significantly different melting points, the two polymers may have another significantly different property, such as solubility in a solvent, so that the support material may be removed without affecting the build material of the mold. In this regard, a particularly preferred build material is Protobuild green wax available from Sanders Prototyping, Inc. of Wilton, N.H. and having a melting point of 120° C., and a particularly preferred support material is Protosupport red wax, also available from Sanders Prototyping, Inc. and having a melting point of 90° C.

Figure 6:
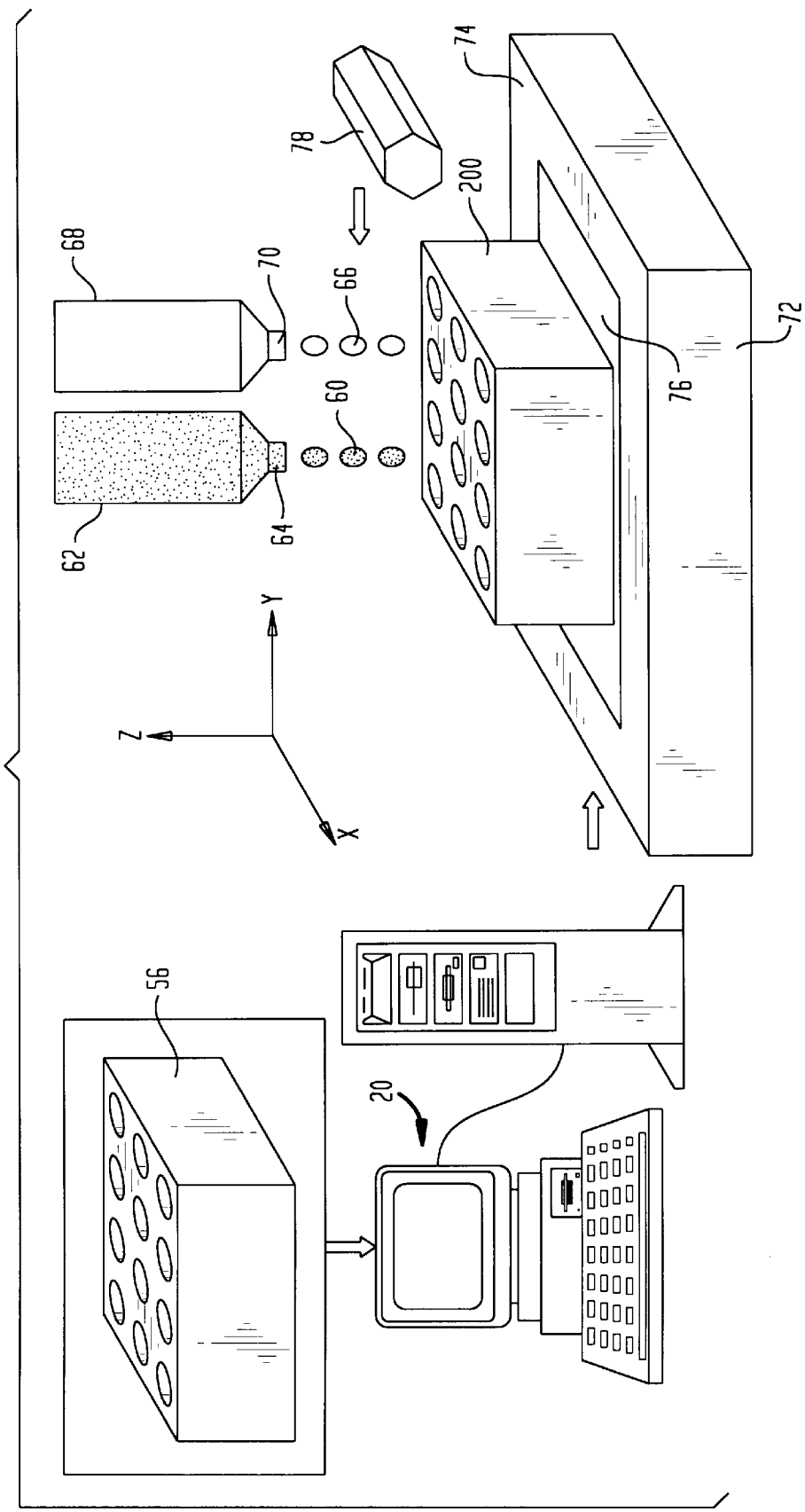
FIG. 6 is a diagrammatic view showing the step of fabricating a photonic bandgap device indirectly using a Sanders prototyping technique.

A forming step which may be used in an indirect forming method in accordance with Sanders prototyping is shown diagrammatically in FIG. 6. According to the process, a build material 60 is supplied to a heated reservoir 62 which holds build material 60 in a liquid state. Heated reservoir 62 is associated with one printing head 64 of a Sanders prototyping apparatus. Similarly, support material 66 is supplied to a heated reservoir 68 which holds support material 66 in a liquid state. Heated reservoir 68 is associated with a second printing head 70 of the Sanders prototyping apparatus. Heated pumps transfer the heated build material 60 and heated support material 66 to printing heads 64 and 70, respectively. Printing heads 64 and 70 are positioned in close proximity to the build platform 72 on which mold 200 is to be built. Printing head 64 and 70 and build platform 72 are supported in a conventional manner for movement relative to one another along the "X," "Y" and "Z" axes as shown. For example, printing heads 64 and 70 may be mounted for movement in the X and Y directions, and build platform 72 may be mounted for separate movement in the Z direction toward and away from the printing heads.

The drive systems for moving printing heads 64 and 70 and build platform 72 may be controlled by drive signals generated from a computer 20 running a commercially available or custom CAD-based program. Utilizing such program, a desired mold structure 56 may be inputted to computer 20. The desired structure then may be sectioned into multiple layers by a software program to provide data corresponding to the particular shape of each individual layer of the mold. The layering data signals may then be used to actuate the drive systems for moving printing head 64 and 70 and build platform 72 in the X, Y and Z directions, respectively.

Printing heads 64 and 70 selectively dispense build material 60 and support material 66, respectively, according to signals received from computer 20 and its associated software. Thus, when actuated, each printing head deposits a droplet about 70 microns in diameter onto the receiving surface 74 of build platform 72. Receiving surface 74 preferably includes a substrate 76 on which mold 200 is built, the substrate minimizing localized shrinkage in the foundation layer of mold 200 and permitting the mold to be released from build platform 72 without damage. Preferred substrate materials are those described above in connection with the fused deposition process. In this regard, a particularly preferred substrate material is a low density foam available from Sanders Prototyping, Inc.

As indicated in FIG. 6, the drive signals generated from computer 20 selectively move printing heads 64 and 70 and build platform 72 with respect to one another in a predetermined pattern as a single layer of droplets of build material 60 and support material 66 are selectively dispensed to form mold 200. In a typical scenario, droplets of the build material may be deposited to "print" a straight line of the build material on the substrate in a first direction. Multiple passes may be made to deposit lines of the build material adjacent to one another to form a solid layer with a one droplet thickness. Such layer may have a thickness of about 60–75 microns. Where the layering data identifies a region of the layer in which there is to be a void space, that region of the layer may be left empty, i.e., no material may be deposited in that region. Alternatively, droplets of the support material may be deposited to fill those regions of the layer where the void spaces are to occur. In this latter method, each layer would be completely filled with regions defining the mold being filled with build material 60 and regions defining the void spaces being filled with support material 66.

After the first layer has been deposited, the printing heads 64 and 70 deposit a second layer about 60–75 microns thick thereover according to the same pattern to form a layer pair. After the second layer has been completed, the printing heads 64 and 70 may move away from the layer by a predetermined layer thickness in the Z direction. The process may then be repeated to form a third layer, one droplet thick, on top of the second layer by depositing build material 60 alone, or build material 60 and support material 66 together to fill the entire layer. The process is repeated until all of the layers have been deposited to form the desired article.

Each droplet of material is dispensed in a fluid state, solidifies and adheres to the previous layer. This forms a strong bond between droplets and between layers. The multiple layers generally will be of a uniform thickness. In order to maintain the layer thickness, a milling step may be performed after the deposition of each layer pair. Preferably, the milling step will be performed after a delay to ensure that all of the deposited material in the second layer of the pair has cooled to a solid state. Such milling step may utilize a horizontal milling head 78 having a rotating cutting blade which is movable in the X or Y direction across the surface of the deposited layer. The milling head may be controlled to remove 20–30 microns of the thickness of the layer pair to yield a layer pair between about 90 microns and about 130 microns thick. The milling step eliminates the surface roughness resulting from the deposition of droplets adjacent to one another, creating a flat, planar surface for the deposition of the next layer.

After the mold has been formed, one of the thermoplastic materials, either the build material or the support material, is removed by solvent extraction, heating, etc. to yield either a matrix phase formed by the remaining thermoplastic material, or a latticework of the remaining thermoplastic material which may act as a mold for defining the hole pattern in the photonic bandgap structure. Thus, in one embodiment, the photonic bandgap structure may be formed by removing the thermoplastic material from around the latticework, pouring a slurry (as described above) to form a matrix phase around this latticework, solidifying the slurry, removing the latticework to yield a pattern of holes in the matrix phase, either leaving the holes unfilled or filling them with another material, and subjecting the part to binder removal, sintering, infiltration and/or other steps as desired. Alternatively, where desired, the thermoplastic material of the latticework may be left in place to form part of the final structure. In another embodiment, the photonic bandgap structure may be formed by removing the thermoplastic material defining the latticework, pouring a slurry to fill the latticework, solidifying the slurry, removing the matrix phase from around the latticework, either leaving the matrix phase unfilled or filling it with another material, and subjecting the part to binder removal, sintering, infiltration and/or other steps as desired. As above, the thermoplastic material of the matrix phase may be left in place to form part of the final structure.

The following examples illustrate certain features of the invention as described above.

EXAMPLE I

An $Al_2O_3$ powder commercially available from various sources, such as Ceralox alumina from Vista Chemical Company of Houston, Tex., is used as the particulate component. The binder system is commercially available from Stratasys, Inc. of Eden Prairie, Minn. under the designation RU9 wax and includes 18.75 wt % of a polymer, 20.25 wt % of a wax, 26.5 wt % of an elastomer, and 35.5 wt % of a tackifier. A mixture is made from these components in a torque rheometer mixer heated to a temperature of 100° C. by melting 94.5 gm of the binder in the mixer and, with the blades rotating, gradually adding 457.4 gm of the $Al_2O_3$ powder to achieve a substantially homogeneous mixture consisting of 55 volume percent $A_2O_3$ and 45 volume percent binder. This procedure is repeated to yield a total of at least 1500 gm of the mixture. The mixture is then cooled, granulated using a grinder, and sieved to segregate the granulated material having a particle size between 1 mm and 4 mm.

The segregated fraction of the granulated mixture is then extruded using a twin screw extruder having an outlet diameter of 0.07 inches. With the screws of the extruder rotating at speeds of 5–15 rpm, filaments having a diameter of between 0.069–0.071 inches are formed.

The filaments are used to fabricate photonic bandgap structures of various shapes using a fused deposition process. In this process, the filaments are fed into the dispensing head of a fused deposition apparatus heated to a temperature of 165–185° C. and dispensed in road widths of 0.01–0.025 inches onto a substrate on the surface of a build platform in an environment of 35–40° C. The articles are built in layer thicknesses of 0.01–0.03 inches, with the dispensing head moving at a speed of 0.5 inches per second relative to the build platform. The material is dispensed from the dispensing head at a flow rate of 0.05 cc/min–0.75 cc/min depending upon the road width and layer thickness used.

Once the articles are completely built and removed from the substrate, they are placed in an alumina crucible or boat and completely embedded in an activated charcoal setter material. The entire assembly is then placed in a mullite tube furnace and heated through a two-stage binder removal cycle. The first stage of the cycle, conducted in a flowing nitrogen environment, consists of the following schedule: a heating rate of 30° C. per hour from room temperature to 50° C.; a one hour hold or "soak" at 50° C.; a heating rate of 7° C. per hour from 50° C. to 80° C.; a one hour soak at 80° C.; a heating rate of 3° C. per hour from 80° C. to 150° C.; a two hour soak at 150° C.; a heating rate of 2° C. per hour from 150° C. to 350° C.; a five hour soak at 350° C. The articles are then cooled from 350° C. to room temperature at a cooling rate of 10° C. per minute. For articles heated through this first stage of the binder removal cycle, 95–97 wt. % of the total binder is removed from the articles.

In the second stage of the binder removal cycle, the articles are placed in an alumina boat without any setter material and heated in a mullite tube furnace in a static air environment. The second stage of the cycle consists of the following schedule: a heating rate of 20° C. per hour from room temperature to 300° C.; a five hour soak at 300° C.; a heating rate of 5° C. per hour from 300° C. to 450° C.; and a fifteen hour soak at 450° C. The articles are then cooled from 450° C. to room temperature at a cooling rate of 10° C. per minute. This second stage of the cycle removes the remainder of the binder, which consists mostly of residual carbon, from the articles.

Following binder removal, the articles are placed inside an alumina crucible and sintered in an air environment to a temperature of 1400° C. to 1500° C. for from ten minutes to several hours, at a heating rate of 3–5° C. per minute. Since $Al_2O_3$ can be sintered in air, the second stage of the binder removal cycle can be combined with the sintering step.

EXAMPLE II

The indirect stereolithography process is used to form a mold for a photonic bandgap structure. A photopolymerizable liquid solution available under the designation SL 5170 from Ciba Geigy Corp. of East Lansing, Mich. is placed in a stereolithography apparatus, such as Model No. SLA-190 available from 3D Systems, Inc. of Valencia, Calif. The solution is filled in the tank to cover the build platform by a depth of from 150–200 microns, i.e., one layer thickness. A 30 milliwatt UV laser (Ar-ion at 351 nm) having a beam diameter of 250 microns is positioned above the solution and is selectively actuated and moved relative to the build platform to polymerize one layer thickness of solution in selected regions above the build platform. The build platform is then lowered by 150–200 microns, or another layer thickness, causing the solution to flow over the polymerized layer. A recoat blade then passes across the surface to define the next layer of unpolymerized solution. The laser then scans this new surface to polymerize the second layer and bond it to the first. The process is repeated until each of the layers have been polymerized and the complete mold has been built.

Once the mold has been completed, it is lifted from the solution tank and rinsed with a solvent to remove any unpolymerized liquid from its surface. It is then subjected to UV light for 48 hours to polymerize any of the monomer in the mold which has not been cross-linked. A ceramic slurry is then used to fill the open void spaces of the mold. The slurry is formed from high purity Ceralox alumina having an average particle size of 0.5 microns and a surface area of 9.3 $m^2$/gm. Fifty grams of the $Al_2O_3$ powder were then ball milled for about four hours along with three grams of Darvan 7 dispersant and 10 grams of distilled water. Subsequently, 1.5 gms. of glycerin and 3.5 gms. of Durmax 1035 binder were added to the ball-milled material and the entire mixture was agitated by hand for 8–10 minutes to form a slurry. The slurry was evacuated in a vacuum chamber for 5–10 seconds until sudden frothing started, and then was brought back to atmospheric pressure. The slurry was then filtered through a 100 mesh stainless steel filter and collected in a powder-free Latex glove. Mold infiltration was carried out by placing the mold on top of the glove and gradually squeezing the glove from below. This procedure was effective in eliminating the trapped air in all parts of the mold and resulted in uniform infiltration.

The slurry within the mold was then dried slowly in air at room temperature for 12 hours, followed by oven drying at 60° C. for 6 hours to remove the water content. The dried assembly was then placed on a bed of 100 mesh alumina powder and heated through a binder removal cycle consisting of the following schedule: a heating rate of 1° C. per minute from room temperature to 45° C.; a heating rate of 0.5° C. per minute from 45° C. to 120°C.; a 2 hour soak at 120° C.; a heating rate of 1° C. per minute from 120° C. to 350° C.; a 1 hour soak at 350°C.; a heating rate of 3° C. per minute from 350° C. to 780°C.; and a 1 hour soak at 780° C. The furnace was then shut off and the resultant structure allowed to cool to ambient. This binder removal cycle eliminated the mold and yielded a periodic latticework of alumina in the desired photonic bandgap structure. The binder burnout cycle also removed the Durmax binder which had been a component of the slurry.

Following binder and mold removal, the alumina articles were sintered in an air environment to a temperature of 1600° C. for 1 hour at a heating rate of 3–5° C. per minute to yield the final photonic bandgap structure.

EXAMPLE III

A Sanders Prototyping Model Maker II is used in an indirect process to form a mold for a photonic bandgap structure. The Model Maker II has two heated printing heads and a heated reservoir associated with each printing head through heated conduits. Protobuild green wax having a melting point of 120° C. (Sanders Prototyping, Inc.) is placed in one heated reservoir, and Protosupport red wax having a melting point of 90° C. (Sanders Prototyping, Inc.) is placed in the other heated reservoir. Based on signals from the computer software, the printing heads are moved through X and Y coordinates to deposit 70 micron droplets of the red and green waxes to form a 60 micron thick first layer of a mold on a foam substrate. The green wax is deposited in those regions which are ultimately to be occupied by air gaps in the photonic bandgap structure, and the red wax is deposited in those regions which are ultimately to be occupied by the solid material in the photonic bandgap structure. A second 60 micron thick layer is then deposited according to the same pattern as the first layer. Once the two layers have been completely formed, there is a delay of about 30–40 seconds to permit all of the deposited wax in the layer to solidify, after which a horizontal milling head traverses the layer to remove about 20 microns of wax from the top surface of the second layer, yielding a 100 micron thick composite layer having a flat, planar surface. The build platform is then lowered by about a layer thickness (i.e., about 100 microns) and the process is repeated to deposit two layers about 60 microns thick each consisting of regions of red wax and regions of green wax. Again, a milling operation is performed to remove about 20 microns of wax from the top surface of the uppermost layer, and the process is repeated until the entire mold has been built.

The completed mold is then placed in a bath of Bioact VS-0 solvent at 60–70° C. to dissolve the red support wax from the mold structure without affecting the green build wax. With the assistance of ultrasonic agitation, the removal of the red wax was completed in 1–2 hours.

The resultant mold, consisting only of regions formed from the green build wax, is infiltrated with the alumina slurry of Example II to fill the open void spaces left remaining following removal of the red support wax. The slurry was dried and the wax mold and binders removed following the schedules set forth in Example II. Following binder and mold removal, sintering was performed according to the schedule of Example II.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims. For example, rather than the solid freeform fabrication techniques described above, other solid freeform fabrication techniques may be used, including selective laser sintering, laminated object manufacturing, three dimensional printing and the like.

We claim:

1. A method for making a photonic bandgap device including a matrix phase and a periodic structural array extending through said matrix phase, said method comprising the steps of:

creating a representation of said photonic bandgap device on a computer, said representation including a plurality of segments defining said matrix phase and said periodic structural array;

generating program signals corresponding to each of said segments in a predetermined sequence;

providing at least one mixture of a particulate composition dispersed in a binder;

forming a plurality of layers of said at least one mixture on top of one another according to said program signals with the formation of each successive layer being controlled to take place after said at least one mixture in said preceding layer has solidified, at least some of said layers including a matrix phase portion and a periodic structural array portion, wherein one of said portions includes said at least one mixture in solid form and another one of said portions does not include said at least one mixture in solid form.

2. A method as claimed in claim 1, wherein said mixture providing step includes the step of providing a first mixture of a particulate composition dispersed in a binder and a second mixture of a particulate composition dispersed in a binder, and said forming step includes the step of forming said matrix phase portions of said layers from said first mixture and said periodic structural array portions of said layers from said second mixture.

3. A method for making a photonic bandgap device including a matrix phase and a periodic structural array extending through said matrix phase, said method comprising the steps of:

creating a representation of a mold for said photonic bandgap device on a computer, said representation including a plurality of segments defining said mold and a cavity within said mold;

generating program signals corresponding to each of said segments in a predetermined sequence;

providing a material having a fluid state and a solid state;

forming a plurality of layers of said material on top of one another according to said program signals with the formation of each successive layer being controlled to take place after said material in said preceding layer has solidified, at least some of said layers including a mold portion containing said material in said solid state and a cavity portion not containing said material in said solid state, said mold portions corresponding to said matrix phase of said photonic bandgap device and said cavity portions corresponding to said periodic structural array of said photonic bandgap device;

providing a suspension of a solid particulate material dispersed in a fluid vehicle;

introducing said suspension into said mold to fill at least a portion of said cavity; and solidifying said suspension in said cavity, whereby said solidified suspension defines said periodic structural array of said photonic bandgap device and said mold occupies a region corresponding to said matrix phase of said photonic bandgap device.

4. A method as claimed in claim 3, further comprising the step of removing said mold from said solidified suspension.

5. A method for making a photonic bandgap device including a matrix phase and a periodic structural array extending through said matrix phase, said method comprising the steps of:

creating a representation of a mold for said photonic bandgap device on a computer, said representation including a plurality of segments defining said mold and a cavity within said mold;

generating program signals corresponding to each of said segments in a predetermined sequence;

providing a material having a fluid state and a solid state;

forming a plurality of layers of said material on top of one another according to said program signals with the formation of each successive layer being controlled to take place after said material in said preceding layer has solidified, at least some of said layers including a mold portion containing said material in said solid state and a cavity portion not containing said material in said solid state, said mold portions corresponding to said periodic structural array of said photonic bandgap device and said cavity portions corresponding to said matrix phase of said photonic bandgap device;

providing a suspension of a solid particulate material dispersed in a fluid vehicle;

introducing said suspension into said mold to fill at least a portion of said cavity; and solidifying said suspension in said cavity, whereby said solidified suspension defines said matrix phase of said photonic bandgap device and said mold occupies a region corresponding to said periodic structural array of said photonic bandgap device.

6. A method as claimed in claim 5, further comprising the step of removing said mold from said solidified suspension.

* * * * *

UNITED STATES PATENT AND TRADEMARK OFFICE
CERTIFICATE OF CORRECTION

PATENT NO. : 5,997,795
DATED : December 7, 1999
INVENTOR(S) : Danforth et al.

It is certified that error appears in the above-identified patent and that said Letters Patent is hereby corrected as shown below:

Column 8, line 11, "Theological" should read --rheological--.
Column 28, line 18, "A$_2$O$_3$" should read --AL$_2$O$_3$--.

Signed and Sealed this

Twenty-sixth Day of September, 2000

*Attest:*

Q. TODD DICKINSON

*Attesting Officer*  *Director of Patents and Trademarks*